United States Patent
Uzoh

(10) Patent No.: US 12,033,943 B2
(45) Date of Patent: Jul. 9, 2024

(54) LATERALLY UNCONFINED STRUCTURE

(71) Applicant: ADEIA SEMICONDUCTOR BONDING TECHNOLOGIES INC., San Jose, CA (US)

(72) Inventor: Cyprian Emeka Uzoh, San Jose, CA (US)

(73) Assignee: ADEIA SEMICONDUCTOR BONDING TECHNOLOGIES INC., San Jose, CA (US)

( * ) Notice: Subject to any disclaimer, the term of this patent is extended or adjusted under 35 U.S.C. 154(b) by 0 days.

(21) Appl. No.: 18/342,515

(22) Filed: Jun. 27, 2023

(65) Prior Publication Data

US 2024/0071915 A1 Feb. 29, 2024

Related U.S. Application Data

(63) Continuation of application No. 17/314,555, filed on May 7, 2021, now Pat. No. 11,735,523.

(Continued)

(51) Int. Cl.
*H01L 21/00* (2006.01)
*H01L 21/768* (2006.01)
*H01L 23/528* (2006.01)

(52) U.S. Cl.
CPC ...... *H01L 23/528* (2013.01); *H01L 21/76898* (2013.01)

(58) Field of Classification Search
CPC .......................... H01L 23/528; H01L 21/76898
See application file for complete search history.

(56) References Cited

U.S. PATENT DOCUMENTS

| | | |
|---|---|---|
| 4,939,568 A | 7/1990 | Kato et al. |
| 4,998,665 A | 3/1991 | Hayashi |

(Continued)

FOREIGN PATENT DOCUMENTS

| | | | |
|---|---|---|---|
| CN | 1935630 A | * | 3/2007 |
| CN | 1935630 A | | 3/2007 |

(Continued)

OTHER PUBLICATIONS

Akolkar, R., "Current status and advances in Damascene Electrodeposition," Encyclopedia of Interfacial Chemistry: Surface Science and Electrochemistry, 2017, 8 pages.

(Continued)

*Primary Examiner* — Laura M Menz
(74) *Attorney, Agent, or Firm* — Knobbe, Martens, Olson & Bear, LLP

(57) ABSTRACT

Techniques are employed to mitigate the anchoring effects of cavity sidewall adhesion on an embedded conductive interconnect structure, and to allow a lower annealing temperature to be used to join opposing conductive interconnect structures. A vertical gap may be disposed between the conductive material of an embedded interconnect structure and the sidewall of the cavity to laterally unpin the conductive structure and allow uniaxial expansion of the conductive material. Additionally or alternatively, one or more vertical gaps may be disposed within the bonding layer, near the embedded interconnect structure to laterally unpin the conductive structure and allow uniaxial expansion of the conductive material.

20 Claims, 16 Drawing Sheets

Related U.S. Application Data

(60) Provisional application No. 63/026,909, filed on May 19, 2020.

(56) References Cited

U.S. PATENT DOCUMENTS

| | | | |
|---|---|---|---|
| 5,087,585 A | 2/1992 | Hayashi | |
| 5,236,118 A | 8/1993 | Bower et al. | |
| 5,322,593 A | 6/1994 | Hasegawa et al. | |
| 5,413,952 A | 5/1995 | Pages et al. | |
| 5,442,235 A | 8/1995 | Parrillo et al. | |
| 5,489,804 A | 2/1996 | Pasch | |
| 5,501,003 A | 3/1996 | Bernstein | |
| 5,503,704 A | 4/1996 | Bower et al. | |
| 5,516,727 A | 5/1996 | Broom | |
| 5,610,431 A | 3/1997 | Martin | |
| 5,734,199 A | 3/1998 | Kawakita et al. | |
| 5,753,536 A | 5/1998 | Sugiyama et al. | |
| 5,771,555 A | 6/1998 | Eda et al. | |
| 5,821,692 A | 10/1998 | Rogers et al. | |
| 5,866,942 A | 2/1999 | Suzuki et al. | |
| 5,985,739 A | 11/1999 | Plettner et al. | |
| 5,998,808 A | 12/1999 | Matsushita | |
| 6,008,126 A | 12/1999 | Leedy | |
| 6,063,968 A | 5/2000 | Hubner et al. | |
| 6,071,761 A | 6/2000 | Jacobs | |
| 6,080,640 A | 6/2000 | Gardner et al. | |
| 6,097,096 A | 8/2000 | Gardner et al. | |
| 6,123,825 A | 9/2000 | Uzoh et al. | |
| 6,147,000 A | 11/2000 | You et al. | |
| 6,232,150 B1 | 5/2001 | Lin et al. | |
| 6,258,625 B1 | 7/2001 | Brofman et al. | |
| 6,259,160 B1 | 7/2001 | Lopatin et al. | |
| 6,265,775 B1 | 7/2001 | Seyyedy | |
| 6,297,072 B1 | 10/2001 | Tilmans et al. | |
| 6,316,786 B1 | 11/2001 | Mueller et al. | |
| 6,333,120 B1 | 12/2001 | DeHaven et al. | |
| 6,333,206 B1 | 12/2001 | Ito et al. | |
| 6,348,709 B1 | 2/2002 | Graettinger et al. | |
| 6,374,770 B1 | 4/2002 | Lee | |
| 6,409,904 B1 | 6/2002 | Uzoh et al. | |
| 6,423,640 B1 | 7/2002 | Lee et al. | |
| 6,465,892 B1 | 10/2002 | Suga | |
| 6,528,894 B1 | 3/2003 | Akram et al. | |
| 6,552,436 B2 | 4/2003 | Burnette et al. | |
| 6,555,917 B1 | 4/2003 | Heo | |
| 6,579,744 B1 | 6/2003 | Jiang | |
| 6,583,515 B1 | 6/2003 | James et al. | |
| 6,589,813 B1 | 7/2003 | Park | |
| 6,600,224 B1 | 7/2003 | Farquhar et al. | |
| 6,624,003 B1 | 9/2003 | Rice | |
| 6,627,814 B1 | 9/2003 | Stark | |
| 6,632,377 B1 | 10/2003 | Brusic et al. | |
| 6,660,564 B2 | 12/2003 | Brady | |
| 6,667,225 B2 | 12/2003 | Hau-Riege et al. | |
| 6,828,686 B2 | 12/2004 | Park | |
| 6,837,979 B2 | 1/2005 | Uzoh et al. | |
| 6,864,585 B2 | 3/2005 | Enquist | |
| 6,887,769 B2 | 5/2005 | Kellar et al. | |
| 6,902,987 B1 | 6/2005 | Tong et al. | |
| 6,908,027 B2 | 6/2005 | Tolchinsky et al. | |
| 6,909,194 B2 | 6/2005 | Farnworth et al. | |
| 6,962,835 B2 | 11/2005 | Tong et al. | |
| 6,974,769 B2 | 12/2005 | Basol et al. | |
| 7,045,453 B2 | 5/2006 | Canaperi et al. | |
| 7,078,811 B2 | 7/2006 | Suga | |
| 7,105,980 B2 | 9/2006 | Abbott et al. | |
| 7,109,063 B2 | 9/2006 | Jiang | |
| 7,126,212 B2 | 10/2006 | Enquist et al. | |
| 7,193,423 B1 | 3/2007 | Dalton et al. | |
| 7,354,798 B2 | 4/2008 | Pogge et al. | |
| 7,485,968 B2 | 2/2009 | Enquist et al. | |
| 7,750,488 B2 | 7/2010 | Patti et al. | |
| 7,803,693 B2 | 9/2010 | Trezza | |
| 7,998,335 B2 | 8/2011 | Feeney et al. | |
| 8,039,966 B2 | 10/2011 | Yang et al. | |
| 8,168,532 B2 | 5/2012 | Haneda et al. | |
| 8,183,127 B2 | 5/2012 | Patti et al. | |
| 8,241,961 B2 | 8/2012 | Kim et al. | |
| 8,242,600 B2 | 8/2012 | Yang et al. | |
| 8,314,007 B2 | 11/2012 | Vaufredaz | |
| 8,349,635 B1 | 1/2013 | Gan et al. | |
| 8,377,798 B2 | 2/2013 | Peng et al. | |
| 8,435,421 B2 | 5/2013 | Keleher et al. | |
| 8,441,131 B2 | 5/2013 | Ryan | |
| 8,476,146 B2 | 7/2013 | Chen et al. | |
| 8,476,165 B2 | 7/2013 | Trickett et al. | |
| 8,482,132 B2 | 7/2013 | Yang et al. | |
| 8,501,537 B2 | 8/2013 | Sadaka et al. | |
| 8,524,533 B2 | 9/2013 | Tong et al. | |
| 8,620,164 B2 | 12/2013 | Heck et al. | |
| 8,647,987 B2 | 2/2014 | Yang et al. | |
| 8,697,493 B2 | 4/2014 | Sadaka | |
| 8,716,105 B2 | 5/2014 | Sadaka et al. | |
| 8,802,538 B1 | 8/2014 | Liu | |
| 8,809,123 B2 | 8/2014 | Liu et al. | |
| 8,841,002 B2 | 9/2014 | Tong | |
| 8,988,299 B2 | 3/2015 | Kam et al. | |
| 9,000,600 B2 | 4/2015 | Uzoh et al. | |
| 9,093,350 B2 | 7/2015 | Endo et al. | |
| 9,142,517 B2 | 9/2015 | Liu et al. | |
| 9,171,756 B2 | 10/2015 | Enquist et al. | |
| 9,184,125 B2 | 11/2015 | Enquist et al. | |
| 9,224,704 B2 | 12/2015 | Landru | |
| 9,230,941 B2 | 1/2016 | Chen et al. | |
| 9,257,399 B2 | 2/2016 | Kuang et al. | |
| 9,269,612 B2 | 2/2016 | Chen et al. | |
| 9,299,736 B2 | 3/2016 | Chen et al. | |
| 9,312,229 B2 | 4/2016 | Chen et al. | |
| 9,331,149 B2 | 5/2016 | Tong et al. | |
| 9,337,235 B2 | 5/2016 | Chen et al. | |
| 9,343,330 B2 | 5/2016 | Brusic et al. | |
| 9,349,669 B2 | 5/2016 | Uzoh et al. | |
| 9,368,866 B2 | 6/2016 | Yu | |
| 9,385,024 B2 | 7/2016 | Tong et al. | |
| 9,394,161 B2 | 7/2016 | Cheng et al. | |
| 9,431,368 B2 | 8/2016 | Enquist et al. | |
| 9,437,572 B2 | 9/2016 | Chen et al. | |
| 9,443,796 B2 | 9/2016 | Chou et al. | |
| 9,461,007 B2 | 10/2016 | Chun et al. | |
| 9,496,239 B1 | 11/2016 | Edelstein et al. | |
| 9,536,848 B2 | 1/2017 | England et al. | |
| 9,559,081 B1 | 1/2017 | Lai et al. | |
| 9,620,481 B2 | 4/2017 | Edelstein et al. | |
| 9,633,971 B2 | 4/2017 | Uzoh | |
| 9,656,852 B2 | 5/2017 | Cheng et al. | |
| 9,723,716 B2 | 8/2017 | Meinhold | |
| 9,728,521 B2 | 8/2017 | Tsai et al. | |
| 9,741,620 B2 | 8/2017 | Uzoh et al. | |
| 9,799,587 B2 | 10/2017 | Fujii et al. | |
| 9,852,988 B2 | 12/2017 | Enquist et al. | |
| 9,881,882 B2 | 1/2018 | Hsu et al. | |
| 9,893,004 B2 | 2/2018 | Yazdani | |
| 9,899,442 B2 | 2/2018 | Katkar | |
| 9,929,050 B2 | 3/2018 | Lin | |
| 9,941,241 B2 | 4/2018 | Edelstein et al. | |
| 9,941,243 B2 | 4/2018 | Kim et al. | |
| 9,953,941 B2 | 4/2018 | Enquist | |
| 9,960,142 B2 | 5/2018 | Chen et al. | |
| 10,002,844 B1 | 6/2018 | Wang et al. | |
| 10,026,605 B2 | 7/2018 | Doub et al. | |
| 10,075,657 B2 | 9/2018 | Fahim et al. | |
| 10,147,641 B2 | 12/2018 | Enquist et al. | |
| 10,204,893 B2 | 2/2019 | Uzoh et al. | |
| 10,269,708 B2 | 4/2019 | Enquist et al. | |
| 10,269,756 B2 | 4/2019 | Uzoh | |
| 10,276,619 B2 | 4/2019 | Kao et al. | |
| 10,276,909 B2 | 4/2019 | Huang et al. | |
| 10,418,277 B2 | 9/2019 | Cheng et al. | |
| 10,434,749 B2 | 10/2019 | Tong et al. | |
| 10,446,456 B2 | 10/2019 | Shen et al. | |
| 10,446,487 B2 | 10/2019 | Huang et al. | |
| 10,446,532 B2 | 10/2019 | Uzoh et al. | |
| 10,508,030 B2 | 12/2019 | Katkar et al. | |
| 10,515,913 B2 | 12/2019 | Katkar et al. | |

(56) References Cited

U.S. PATENT DOCUMENTS

| | | |
|---|---|---|
| 10,522,499 B2 | 12/2019 | Enquist et al. |
| 10,707,087 B2 | 7/2020 | Uzoh et al. |
| 10,784,191 B2 | 9/2020 | Huang et al. |
| 10,790,262 B2 | 9/2020 | Uzoh et al. |
| 10,840,135 B2 | 11/2020 | Uzoh |
| 10,840,205 B2 | 11/2020 | Fountain, Jr. et al. |
| 10,854,578 B2 | 12/2020 | Morein |
| 10,879,212 B2 | 12/2020 | Uzoh et al. |
| 10,886,177 B2 | 1/2021 | DeLaCruz et al. |
| 10,892,246 B2 | 1/2021 | Uzoh |
| 10,923,408 B2 | 2/2021 | Huang et al. |
| 10,923,413 B2 | 2/2021 | DeLaCruz |
| 10,950,547 B2 | 3/2021 | Mohammed et al. |
| 10,964,664 B2 | 3/2021 | Mandalapu et al. |
| 10,985,133 B2 | 4/2021 | Uzoh |
| 10,991,804 B2 | 4/2021 | DeLaCruz et al. |
| 10,998,292 B2 | 5/2021 | Lee et al. |
| 11,004,757 B2 | 5/2021 | Katkar et al. |
| 11,011,494 B2 | 5/2021 | Gao et al. |
| 11,011,503 B2 | 5/2021 | Wang et al. |
| 11,031,285 B2 | 6/2021 | Katkar et al. |
| 11,056,348 B2 | 7/2021 | Theil |
| 11,088,099 B2 | 8/2021 | Katkar et al. |
| 11,127,738 B2 | 9/2021 | DeLaCruz et al. |
| 11,158,606 B2 | 10/2021 | Gao et al. |
| 11,171,117 B2 | 11/2021 | Gao et al. |
| 11,176,450 B2 | 11/2021 | Teig et al. |
| 11,244,920 B2 | 2/2022 | Uzoh |
| 11,256,004 B2 | 2/2022 | Haba et al. |
| 11,264,357 B1 | 3/2022 | DeLaCruz et al. |
| 11,276,676 B2 | 3/2022 | Enquist et al. |
| 11,329,034 B2 | 5/2022 | Tao et al. |
| 11,348,898 B2 | 5/2022 | DeLaCruz et al. |
| 11,355,443 B2 | 6/2022 | Huang et al. |
| 11,735,523 B2 * | 8/2023 | Uzoh ................. H01L 24/05 257/773 |
| 2002/0000328 A1 | 1/2002 | Motomura et al. |
| 2002/0003307 A1 | 1/2002 | Suga |
| 2002/0025665 A1 | 2/2002 | Juengling |
| 2002/0074670 A1 | 6/2002 | Suga |
| 2002/0094661 A1 | 7/2002 | Enquist et al. |
| 2003/0092220 A1 | 5/2003 | Akram |
| 2003/0157748 A1 | 8/2003 | Kim et al. |
| 2004/0084414 A1 | 5/2004 | Sakai et al. |
| 2006/0024950 A1 | 2/2006 | Choi et al. |
| 2006/0057945 A1 | 3/2006 | Hsu et al. |
| 2007/0096294 A1 | 5/2007 | Ikeda et al. |
| 2007/0111386 A1 | 5/2007 | Kim et al. |
| 2008/0122092 A1 | 5/2008 | Hong |
| 2008/0237053 A1 | 10/2008 | Andricacos et al. |
| 2009/0197408 A1 | 8/2009 | Lehr et al. |
| 2009/0200668 A1 | 8/2009 | Yang et al. |
| 2010/0255262 A1 | 10/2010 | Chen et al. |
| 2010/0327443 A1 | 12/2010 | Kim |
| 2011/0074040 A1 | 3/2011 | Frank et al. |
| 2011/0084403 A1 | 4/2011 | Yang et al. |
| 2012/0211894 A1 | 8/2012 | Aoyagi |
| 2012/0212384 A1 | 8/2012 | Kam et al. |
| 2013/0020704 A1 | 1/2013 | Sadaka |
| 2013/0221527 A1 | 8/2013 | Yang et al. |
| 2013/0252399 A1 | 9/2013 | Leduc |
| 2013/0320556 A1 | 12/2013 | Liu et al. |
| 2014/0153210 A1 | 6/2014 | Uzoh |
| 2014/0175655 A1 | 6/2014 | Chen et al. |
| 2014/0225795 A1 | 8/2014 | Yu |
| 2014/0252635 A1 | 9/2014 | Tran et al. |
| 2014/0264948 A1 | 9/2014 | Chou et al. |
| 2014/0353828 A1 | 12/2014 | Edelstein et al. |
| 2015/0064498 A1 | 3/2015 | Tong |
| 2015/0108644 A1 | 4/2015 | Kuang et al. |
| 2015/0206823 A1 | 7/2015 | Lin et al. |
| 2015/0340269 A1 | 11/2015 | Rivoire et al. |
| 2015/0380368 A1 | 12/2015 | Momose et al. |
| 2016/0020183 A1 | 1/2016 | Chuang et al. |
| 2016/0133598 A1 | 5/2016 | Baudin et al. |
| 2016/0190103 A1 * | 6/2016 | Kabe ................. H01L 23/564 257/777 |
| 2016/0276383 A1 | 9/2016 | Chuang et al. |
| 2016/0343682 A1 | 11/2016 | Kawasaki |
| 2017/0047307 A1 | 2/2017 | Uzoh |
| 2017/0069575 A1 | 3/2017 | Haba et al. |
| 2017/0098627 A1 | 4/2017 | Das et al. |
| 2017/0194271 A1 | 7/2017 | Hsu et al. |
| 2017/0355040 A1 | 12/2017 | Utsumi et al. |
| 2018/0151523 A1 | 5/2018 | Chen et al. |
| 2018/0175012 A1 | 6/2018 | Wu et al. |
| 2018/0182639 A1 | 6/2018 | Uzoh et al. |
| 2018/0182665 A1 | 6/2018 | Uzoh et al. |
| 2018/0182666 A1 | 6/2018 | Uzoh et al. |
| 2018/0190580 A1 | 7/2018 | Haba et al. |
| 2018/0190583 A1 | 7/2018 | DeLaCruz et al. |
| 2018/0219038 A1 | 8/2018 | Gambino et al. |
| 2018/0273377 A1 | 9/2018 | Katkar et al. |
| 2018/0295718 A1 | 10/2018 | Uzoh et al. |
| 2018/0323177 A1 | 11/2018 | Yu et al. |
| 2018/0323227 A1 | 11/2018 | Zhang et al. |
| 2018/0331066 A1 | 11/2018 | Uzoh et al. |
| 2019/0096741 A1 | 3/2019 | Uzoh et al. |
| 2019/0115277 A1 | 4/2019 | Yu et al. |
| 2019/0131277 A1 | 5/2019 | Yang et al. |
| 2019/0198407 A1 | 6/2019 | Huang et al. |
| 2019/0198409 A1 | 6/2019 | Katkar et al. |
| 2019/0265411 A1 | 8/2019 | Huang et al. |
| 2019/0333550 A1 | 10/2019 | Fisch |
| 2019/0348336 A1 | 11/2019 | Katkar et al. |
| 2019/0385935 A1 * | 12/2019 | Gao ................. H01L 25/0657 |
| 2019/0385966 A1 * | 12/2019 | Gao ................. H01L 25/0657 |
| 2019/0385982 A1 * | 12/2019 | Lee ................. H01L 24/09 |
| 2019/0393086 A1 | 12/2019 | Uzoh |
| 2020/0006280 A1 | 1/2020 | Shah et al. |
| 2020/0013637 A1 | 1/2020 | Haba |
| 2020/0013765 A1 | 1/2020 | Fountain, Jr. et al. |
| 2020/0035641 A1 | 1/2020 | Fountain, Jr. et al. |
| 2020/0075520 A1 | 3/2020 | Gao et al. |
| 2020/0075553 A1 | 3/2020 | DeLaCruz et al. |
| 2020/0126906 A1 * | 4/2020 | Uzoh ................. H01L 23/481 |
| 2020/0194396 A1 * | 6/2020 | Uzoh ................. H01L 25/0657 |
| 2020/0227367 A1 | 7/2020 | Haba et al. |
| 2020/0243380 A1 | 7/2020 | Uzoh et al. |
| 2020/0279821 A1 | 9/2020 | Haba et al. |
| 2020/0294908 A1 | 9/2020 | Haba et al. |
| 2020/0328162 A1 | 10/2020 | Haba et al. |
| 2020/0328164 A1 | 10/2020 | DeLaCruz et al. |
| 2020/0328165 A1 | 10/2020 | DeLaCruz et al. |
| 2020/0335408 A1 | 10/2020 | Gao et al. |
| 2020/0365575 A1 | 11/2020 | Uzoh et al. |
| 2020/0371154 A1 | 11/2020 | DeLaCruz et al. |
| 2020/0381389 A1 | 12/2020 | Uzoh et al. |
| 2020/0395321 A1 | 12/2020 | Katkar et al. |
| 2020/0411483 A1 | 12/2020 | Uzoh et al. |
| 2021/0043557 A1 * | 2/2021 | Lee ................. H01L 23/5385 |
| 2021/0098411 A1 | 4/2021 | Liff et al. |
| 2021/0098412 A1 | 4/2021 | Haba et al. |
| 2021/0118864 A1 | 4/2021 | DeLaCruz et al. |
| 2021/0143125 A1 | 5/2021 | DeLaCruz et al. |
| 2021/0181510 A1 | 6/2021 | Katkar et al. |
| 2021/0193603 A1 | 6/2021 | Katkar et al. |
| 2021/0193624 A1 | 6/2021 | DeLaCruz et al. |
| 2021/0193625 A1 | 6/2021 | DeLaCruz et al. |
| 2021/0242152 A1 | 8/2021 | Fountain, Jr. et al. |
| 2021/0257341 A1 * | 8/2021 | Lee ................. H01L 25/0657 |
| 2021/0287981 A1 * | 9/2021 | Shih ................. H01L 23/28 |
| 2021/0296282 A1 | 9/2021 | Gao et al. |
| 2021/0305202 A1 | 9/2021 | Uzoh et al. |
| 2021/0335737 A1 | 10/2021 | Katkar et al. |
| 2021/0366820 A1 * | 11/2021 | Uzoh ................. H01L 24/08 |
| 2021/0407941 A1 | 12/2021 | Haba |
| 2022/0005784 A1 | 1/2022 | Gao et al. |
| 2022/0077063 A1 | 3/2022 | Haba |
| 2022/0077087 A1 | 3/2022 | Haba |
| 2022/0130787 A1 * | 4/2022 | Uzoh ................. H01L 24/05 |
| 2022/0139867 A1 | 5/2022 | Uzoh |
| 2022/0139869 A1 | 5/2022 | Gao et al. |
| 2022/0165692 A1 | 5/2022 | Uzoh et al. |

(56) References Cited

U.S. PATENT DOCUMENTS

| | | |
|---|---|---|
| 2022/0208650 A1 | 6/2022 | Gao et al. |
| 2022/0208702 A1 | 6/2022 | Uzoh |
| 2022/0208723 A1 | 6/2022 | Katkar et al. |
| 2022/0246497 A1 | 8/2022 | Fountain, Jr. et al. |
| 2022/0285213 A1* | 9/2022 | Uzoh ............... H01L 21/76868 |
| 2022/0285303 A1* | 9/2022 | Mirkarimi .............. H01L 24/05 |
| 2022/0302058 A1* | 9/2022 | Gao .................... H01L 25/0657 |
| 2022/0319901 A1 | 10/2022 | Suwito et al. |
| 2022/0320035 A1 | 10/2022 | Uzoh et al. |
| 2022/0320036 A1 | 10/2022 | Gao et al. |
| 2023/0005850 A1 | 1/2023 | Fountain, Jr. |
| 2023/0019869 A1 | 1/2023 | Mirkarimi et al. |
| 2023/0036441 A1 | 2/2023 | Haba et al. |
| 2023/0067677 A1 | 3/2023 | Lee et al. |
| 2023/0069183 A1 | 3/2023 | Haba |
| 2023/0100032 A1 | 3/2023 | Haba et al. |
| 2023/0115122 A1 | 4/2023 | Uzoh et al. |
| 2023/0122531 A1 | 4/2023 | Uzoh |
| 2023/0123423 A1 | 4/2023 | Gao et al. |
| 2023/0125395 A1 | 4/2023 | Gao et al. |
| 2023/0130259 A1 | 4/2023 | Haba et al. |
| 2023/0132632 A1 | 5/2023 | Katkar et al. |
| 2023/0140107 A1 | 5/2023 | Uzoh et al. |
| 2023/0142680 A1 | 5/2023 | Guevara et al. |
| 2023/0154816 A1 | 5/2023 | Haba et al. |
| 2023/0154828 A1 | 5/2023 | Haba et al. |
| 2023/0187264 A1 | 6/2023 | Uzoh et al. |
| 2023/0187317 A1 | 6/2023 | Uzoh |
| 2023/0187412 A1 | 6/2023 | Gao et al. |
| 2023/0197453 A1 | 6/2023 | Fountain, Jr. et al. |
| 2023/0197496 A1 | 6/2023 | Theil |
| 2023/0197559 A1 | 6/2023 | Haba et al. |
| 2023/0197560 A1 | 6/2023 | Katkar et al. |
| 2023/0197655 A1 | 6/2023 | Theil et al. |
| 2023/0207402 A1 | 6/2023 | Fountain, Jr. et al. |
| 2023/0207437 A1 | 6/2023 | Haba |
| 2023/0207474 A1 | 6/2023 | Uzoh et al. |
| 2023/0207514 A1 | 6/2023 | Gao et al. |
| 2023/0215836 A1 | 7/2023 | Haba et al. |
| 2023/0245950 A1 | 8/2023 | Haba et al. |
| 2023/0268300 A1 | 8/2023 | Uzoh et al. |
| 2023/0343734 A1 | 10/2023 | Uzoh et al. |
| 2023/0360950 A1 | 11/2023 | Gao |
| 2023/0361074 A1 | 11/2023 | Uzoh et al. |
| 2023/0380145 A1* | 11/2023 | Chen .................... H10B 12/482 |
| 2024/0006383 A1* | 1/2024 | Lee ......................... H01L 24/80 |

FOREIGN PATENT DOCUMENTS

| | | | | |
|---|---|---|---|---|
| CN | 110010546 A | | 7/2019 | |
| CN | 110010546 A | * | 7/2019 | ....... H01L 21/76898 |
| CN | 111095532 A | * | 5/2020 | ............ H01L 21/52 |
| CN | 217469903 U | * | 9/2022 | |
| CN | 217469903 U | | 9/2022 | |
| JP | 2002-353416 A | | 12/2002 | |
| JP | 2013-033786 A | | 2/2013 | |
| JP | 2018-129475 | | 8/2018 | |
| JP | 2018-160519 | | 10/2018 | |
| KR | 10-2016-0066272 | | 6/2016 | |
| TW | 202343661 A | * | 11/2023 | ......... H01L 21/6835 |
| WO | WO 2005/043584 A2 | | 5/2005 | |
| WO | WO 2019/070571 A1 | | 4/2019 | |
| WO | WO-2019070571 A1 | * | 4/2019 | ............ H01L 21/52 |
| WO | WO 2019/241417 A1 | | 12/2019 | |
| WO | WO 2019/241561 A1 | | 12/2019 | |
| WO | WO 2019/241571 A1 | | 12/2019 | |
| WO | WO-2019241417 A1 | * | 12/2019 | ....... H01L 21/76813 |
| WO | WO-2019241561 A1 | * | 12/2019 | ....... H01L 21/76813 |
| WO | WO-2019241571 A1 | * | 12/2019 | ....... H01L 21/76898 |
| WO | WO-2021236361 A1 | * | 5/2020 | ....... H01L 21/76898 |

OTHER PUBLICATIONS

Bush, Steve, "Electronica: Automotive power modules from On Semi," ElectronicsWeekly.com, indicating an Onsemi AR0820 product was to be demonstrated at a Nov. 2018 trade show, https://www.electronicsweekly.com/news/products/power-supplies/electronica-automotive-power-modules-semi-2018-11/ (published Nov. 8, 2018; downloaded Jul. 26, 2023).

Che, F.X. et al., "Study on Cu protrusion of through-silicon via," IEEE Transactions on Components, Packaging and Manufacturing Technology, May 2013, vol. 3, No. 5, pp. 732-739.

Dela Pena, Eden M. et al., "Electrodeposited copper using direct and pulse currents from electrolytes containing low concentration of additives," School of Chemical and Process Engineering, University of Strathclyde, 2018 Surface and Coating Technology, 40 pages.

De Messemaeker, Joke et al., "Correlation between Cu microstructure and TSV Cu pumping," 2014 Electronic Components & Technology Conference, pp. 613-619.

Di Cioccio, L. et al., "An overview of patterned metal/dielectric surface bonding: Mechanism, alignment and characterization," Journal of The Electrochemical Society, 2011, vol. 158, No. 6, p. P81-P86.

Ganesan, Kousik, "Capable copper electrodeposition process for integrated circuit - substrate packaging manufacturing," A dissertation presented in partial fulfillment of the requirements for the degree Doctor of Philosophy, Arizona State University, May 2018, 320 pages.

Gondcharton, P. et al., "Kinetics of low temperature direct copper-copper bonding," Microsyst Technol, 2015, vol. 21, pp. 995-1001.

Heryanto, A. et al., "Effect of copper TSV annealing on via protrusion for TSV wafer fabrication," Journal of Electronic Materials, 2012, vol. 41, No. 9, pp. 2533-2542.

Hobbs, Anthony et al., "Evolution of grain and micro-void structure in electroplated copper interconnects," Materials Transactions, 2002, vol. 43, No. 7, pp. 1629-1632.

Huang, Q., "Effects of impurity elements on isothermal grain growth of electroplated copper," Journal of The Electrochemical Society, 2018, vol. 165, No. 7, pp. D251-D257.

Huang, Q., "Impurities in the electroplated sub-50 nm Cu lines: The effects of the plating additives," Journal of The Electrochemical Society, 2014, vol. 161, No. 9, pp. D388-D394.

International Search Report and Written Opinion for PCT/US2021/031353, dated Aug. 25, 2021, 7 pages.

Jiang, T. et al., "Plasticity mechanism for copper extrusion in through-silicon vias for three-dimensional interconnects," Applied Physics Letters, 2013, vol. 103, pp. 211906-1-211906-5.

Juang, Jing-Ye et al., "Copper-to-copper direct bonding on highly (111)-oriented nanotwinned copper in No. vacuum ambient," Scientific Reports, Sep. 17, 2018, vol. 8, 11 pages.

Ker, Ming-Dou et al., "Fully process-compatible layout design on bond pad to improve wire bond reliability in CMOS ICs," IEEE Transactions on Components and Packaging Technologies, Jun. 2002, vol. 25, No. 2, pp. 309-316.

Kim, Myung Jun et al., "Characteristics of pulse-reverse electrodeposited Cu thin film," I. Effects of|Anodic Step in the Absence of an Organic Additives, Journal of The Electrochemical Society, 2012, vol. 159, No. 9, pp. D538-D543.

Kim, Myung Jun et al., "Characteristics of pulse-reverse electrodeposited Cu thin film," II. Effects of Organic Additives, Journal of The Electrochemical Society, 2012, vol. 159, No. 9, pp. D544-D548.

Liu, C. et al., "Low-temperature direct copper-to-copper bonding enabled by creep on (111) surfaces of nanotwinned Cu," Scientific Reports, May 12, 2015, 5:09734, pp. 1-11.

Liu, Chien-Min et al., "Effect of grain orientations of Cu seed layers on the growth of <111>-oriented nanotwinned Cu," Scientific Reports, 2014, vol. 4, No. 6123, 4 pages.

Liu, Zi-Yu et al. "Detection and formation mechanism of micro-defects in ultrafine pitch Cu-Cu direct bonding," Chin. Phys. B, 2016, vol. 25, No. 1, pp. 018103-1-018103-7.

Lu, L. et al., "Grain growth and strain release in nanocrystalline copper," Journal of Applied Physics, vol. 89, Issue 11, pp. 6408.

Mendez, Julie Marie, "Characterization of copper electroplating and electropolishing processes for semiconductor interconnect metallization," Submitted in partial fulfillment of the requirements for the

(56) References Cited

OTHER PUBLICATIONS degree of Doctor of Philosophy, Department of Chemical Engineering, Case Western Reserve University, Aug. 2009, 140 pages.

Menk, L.A. et al., "Galvanostatic plating with a single additive electrolyte for bottom-up filling of copper in Mesoscale TSVs," Microsystems and Engineering Sciences Applications (MESA) Complex, Sandia National Laboratories, Albuquerque, New Mexico, 2019 J. Electrochem. Soc. 166, 17 pages.

Moriceau, H. et al., "Overview of recent direct wafer bonding advances and applications, " Advances in Natural Sciences-Nanoscience and Nanotechnology, 2010, 11 pages.

Morrison, Jim et al., "Samsung Galaxy S7 Edge Teardown," Tech Insights (posted Apr. 24, 2016), includes description of hybrid bonded Sony IMX260 dual-pixel sensor, https://www.techinsights.com/blog/samsung-galaxy-s7-edge-teardown, downloaded Jul. 11, 2023, 9 pages.

Mott, D. et al., "Synthesis of size-controlled and shaped copper nanoparticles," Langmuir, 2007, vol. 23, No. 10, pp. 5740-5745.

Nakanishi, H. et al., "Studies on SiO2-SiO2 bonding with hydrofluoric acid. Room temperature and low stress bonding technique for MEMS," Sensors and Actuators, 2000, vol. 79, pp. 237-244.

Oberhammer, J. et al., "Sealing of adhesive bonded devices on wafer level," Sensors and Actuators A, 2004, vol. 110, No. 1-3, pp. 407-412, see pp. 407-412, and Figures 1 (a)-1 (I), 6 pages.

Onsemi AR0820 image, cross section of a CMOS image sensor product. The part in the image was shipped on Sep. 16, 2021. Applicant makes No. representation that the part in the image isidentical to the part identified in the separately submitted reference BUSH, Nov. 8, 2018, ElectronicsWeekly.com ("BUSH article"); however, the imaged part and the part shown in the BUSH article share the part number "Onsemi AR0820.".

Ortleb, Thomas et al., "Controlling macro and micro surface topography for a 45nm copper CMP process using a high resolution profiler," Proc. Of SPIE, 2008, vol. 6922, 11 pages.

Parthasaradhy, N.V., "Practical Electroplating Handbook," 1989, Prentice-Hall, Inc., pp. 54-56.

Plobi, A. et al., "Wafer direct bonding: tailoring adhesion between brittle materials," Materials Science and Engineering Review Journal, 1999, R25, 88 pages.

Saraswat, Stanford Presentation, Cu Interconnect slides, web page web.stanford.edu/class/ee311/NOTES/Cu_Interconnect_Slides.pdf, 19 pages.

Song, Xiaohui, "Atomic study of copper-copper bonding using nanoparticles," Journal of Electronic Packaging, Jun. 2020, vol. 142, 5 pages.

Song, Xiaoning, "Microstructure and mechanical properties of electrodeposited copper films," A thesis submitted to the College of Engineering and Physical Sciences of the University of Birmingham, 2011, web page etheses.bham.ac.uk/id/eprint/1764/, 111 pages.

Sony IMX260 image, cross section of Sony dual-pixel sensor product labeled IMX260, showing peripheral probe and wire bond pads in a bonded structure. The part in the image was shipped in Apr. 2016. Applicant makes No. representation that the part in the image is identical to the part identified in the separately submitted reference MORRISON et al. (Tech Insights article dated Apr. 24, 2016), describing and showing a similar sensor product within the Samsung Galaxy S7; however the imaged part and the part shown in the MORRISON et al. article share the part name "Sony IMX260.".

Suga et al., "Bump-less interconnect for next generation system packaging," Electronic Components and Technology Conference, 2001, IEEE, pp. 1003-1008.

Suga, T., "Feasibility of surface activated bonding for ultra-fine pitch interconnection—A new concept of bump-less direct bonding for system level packaging," The University of Tokyo, Research Center for Science and Technology, 2000 Electronic Components and Technology Conference, 2000 IEEE, pp. 702-705.

Swingle, Karen D., "Nanograin Copper Deposition Using an Impinging Jet Electrode," A Thesis submitted in partial satisfaction of the requirements of the degree of Master of Science, University of California, San Diego, 2013, 102 pages.

Takahashi, K. et al., "Transport phenomena that control electroplated copper filling of submicron vias and trenches," Journal of The Electrochemical Society, 1999, vol. 146, No. 12, pp. 4499-4503.

Zheng, Z. et al., "Study of grain size effect of Cu metallization on interfacial microstructures of solder joints," Microelectronics Reliability, 2019, vol. 99, pp. 44-51.

\* cited by examiner

LATERALLY UNCONFINED STRUCTURE

PRIORITY CLAIM AND CROSS-REFERENCE TO RELATED APPLICATION

This application is a continuation of U.S. patent application Ser. No. 17/314,555, filed May 7, 2021, which claims the benefit under 35 U.S.C. § 119(e)(1) of U.S. Provisional Application No. 63/026,909, filed May 19, 2020, which is hereby incorporated by reference in its entirety.

FIELD

The following description relates to integrated circuits ("ICs"). More particularly, the following description relates to manufacturing IC dies and wafers.

BACKGROUND

Microelectronic elements often comprise a thin slab of a semiconductor material, such as silicon or gallium arsenide, commonly called a semiconductor wafer. A wafer can be formed to include multiple integrated chips or dies on a surface of the wafer and/or partly embedded within the wafer. Dies that are separated from a wafer are commonly provided as individual, prepackaged units. In some package designs, the die is mounted to a substrate or a chip carrier, which is in turn mounted on a circuit panel, such as a printed circuit board (PCB). For example, many dies are provided in packages suitable for surface mounting.

Packaged semiconductor dies can also be provided in "stacked" arrangements, wherein one package is provided, for example, on a circuit board or other carrier, and another package is mounted on top of the first package. These arrangements can allow a number of different dies or devices to be mounted within a single footprint on a circuit board and can further facilitate high-speed operation by providing a short interconnection between the packages. Often, this interconnect distance can be only slightly larger than the thickness of the die itself. For interconnection to be achieved within a stack of die packages, interconnection structures for mechanical and electrical connection may be provided on both sides (e.g., faces) of each die package (except for the topmost package).

Additionally, dies or wafers may be stacked in a three-dimensional arrangement as part of various microelectronic packaging schemes. This can include stacking a layer of one or more dies or wafers on a larger base die or wafer, stacking multiple dies or wafers in a vertical arrangement, and various combinations of both. Dies or wafers may be bonded in a stacked arrangement using various bonding techniques, including direct dielectric bonding, non-adhesive techniques, such as ZiBond® or a hybrid bonding technique, such as DBI®, both available from Invensas Bonding Technologies, Inc. (formerly Ziptronix, Inc.), an Xperi company. The bonding includes a spontaneous process that takes place at ambient conditions when two prepared surfaces are brought together (see for example, U.S. Pat. Nos. 6,864,585 and 7,485,968, which are incorporated herein in their entirety).

There can be a variety of challenges to implementing stacked die and wafer arrangements. When bonding stacked dies using a direct bonding or hybrid bonding technique, it is usually desirable that the surfaces of the dies to be bonded be extremely flat, smooth, and clean. For instance, in general, the surfaces should have a very low variance in surface topography (i.e., nanometer scale variance), so that the surfaces can be closely mated to form a lasting bond.

In general, when direct bonding surfaces containing a combination of a dielectric layer and one or more metal features (e.g., embedded conductive interconnect structures), the dielectric surfaces bond first and the metal of the features expands afterwards, as the metal is heated during annealing. While both the substrate and the metal are heated during annealing, the coefficient of thermal expansion (CTE) of the metal relative to the CTE of the substrate generally dictates that the metal expands much more than the substrate at a particular temperature (e.g., ~300 C). In some cases, the lower expansion of the dielectric relative to the metal can be problematic for direct bonding stacked dies.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

For this discussion, the devices and systems illustrated in the figures are shown as having a multiplicity of components. Various implementations of devices and/or systems, as described herein, may include fewer components and remain within the scope of the disclosure. Alternatively, other implementations of devices and/or systems may include additional components, or various combinations of the described components, and remain within the scope of the disclosure.

SUMMARY

Figure 1A:
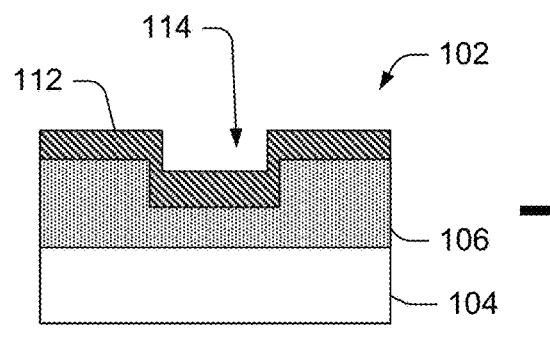
FIGS. 1A-1D show a graphical flow diagram illustrating an example process of preparing and bonding stacked dies or wafers having embedded interconnect structures.

Representative techniques and devices are disclosed, including process steps for forming a microelectronic assembly with a laterally unconfined interconnect structure, according to various embodiments. The techniques and devices relate to preparing microelectronic components and assemblies that have embedded interconnect structures for bonding, including direct bonding as described above. The processes include forming one or more vertical isolation gaps in the material of the embedded interconnect structures or in the insulating material of the bonding layer that surrounds the embedded interconnect structures, in various implementations.

In some embodiments, the processes include masking the bonding surface of the microelectronic component after forming a cavity in the bonding surface. The patterned mask may cover portions of the interior of the cavity as well as the sidewalls of the cavity. The embedded interconnect structure is formed in the patterned cavity, for instance with a damascene process, and when the mask is removed, the vertical isolation gaps are revealed between the sidewalls of the embedded interconnect structure and the sidewalls of the cavity. The vertical isolation gaps relieve natural surface adhesion between the embedded interconnect structure and the sidewalls of the cavity, allowing the material of the embedded interconnect structure more freedom for expansion during annealing.

In other embodiments, the process includes masking the bonding surface of the microelectronic component before or after forming the embedded interconnect structure in the cavity. The patterned mask may cover portions of the insulative material of the bonding layer near to or adjacent the embedded interconnect structure. When the mask is removed, the vertical isolation gaps are revealed in the insulative material of the bonding layer, near to or directly adjacent the sidewalls of the embedded interconnect structure.

In various embodiments, the vertical isolation gaps comprise openings or cavities in the material, arranged to extend normal to the bonding surface, where (in many cases) a first end (e.g., open end) of the vertical isolation gap is exposed at the bonding surface and a second end (e.g., blind end) of the vertical isolation gap is within the material of the bonding layer or a base layer of the microelectronic component or assembly. In some alternate embodiments, the first end of a vertical isolation gap is covered, by the material of the bonding layer or some other material. In some examples, a portion of an isolation gap in close proximity to the bonding surface (or at any point along a length of the isolation gap for that matter) may be closed or partially closed or blocked or partially blocked, forming a blind or partially blind embedded vertical isolation gap. In various embodiments, some vertical isolation gaps are air-filled, or filled with a compressible material such as a microelectronic fill material, an epoxy, or the like.

Vertical isolation gaps are disposed adjacent to or nearby an embedded conductive structure, and partially or fully surround the perimeter of the embedded conductive structure. A vertical isolation gap decouples a conductive structure from the mechanical influence of the bulk of the dielectric bonding layer in which it is embedded.

In various implementations, a microelectronic assembly comprises a first substrate including a first bonding surface with a planarized topography and one or more conductive interconnect structures embedded within a cavity of the first substrate and exposed at the bonding surface. One or more vertical isolation gaps are disposed in the bonding surface of the first substrate, at least partially surrounding a perimeter of the one or more conductive interconnect structures. The one or more vertical isolation gaps are disposed between one or more sidewalls of the cavity and the one or more conductive interconnect structures. One or more of the vertical isolation gaps may be filled with air or a compressible material.

In an embodiment, a second substrate having a bonding surface with a planarized topography is bonded to the first substrate. The second substrate may be bonded to the first bonding surface of the first substrate using a direct dielectric-to-dielectric, non-adhesive technique. The second substrate includes one or more second conductive interconnect structures embedded within a cavity of the second substrate and exposed at the bonding surface of the second substrate. The one or more second conductive interconnect structures are directly bonded to the one or more first conductive interconnect structures.

In an implementation, the second substrate includes one or more vertical isolation gaps disposed in the bonding surface of the second substrate, at least partially surrounding a perimeter of the one or more second conductive interconnect structures, and disposed between a portion of one or more sidewalls of the cavity of the second substrate and the one or more second conductive interconnect structures. In some examples, the one or more second conductive interconnect structures and the one or more first conductive interconnect structures form one or more conductive interconnects, for instance during annealing. The first vertical isolation gap and the second vertical isolation gap form a continuous gap from within the first substrate to within the second substrate.

Various implementations and arrangements are discussed with reference to electrical and electronics components and varied carriers. While specific components (i.e., dies, wafers, integrated circuit (IC) chip dies, substrates, etc.) are mentioned, this is not intended to be limiting, and is for ease of discussion and illustrative convenience. The techniques and devices discussed with reference to a wafer, die, substrate, or the like, are applicable to any type or number of electrical components, circuits (e.g., integrated circuits (IC), mixed circuits, ASICS, memory devices, processors, etc.), groups of components, packaged components, structures (e.g., wafers, panels, boards, PCBs, etc.), and the like, that may be coupled to interface with each other, with external circuits, systems, carriers, and the like. Each of these different components, circuits, groups, packages, structures, and the like, can be generically referred to as a "microelectronic component." For simplicity, unless otherwise specified, components being bonded to another component will be referred to herein as a "die."

The order in which the various processes disclosed herein (graphically and/or textually) are described is not intended to be construed as limiting, and any number of the described process blocks in the processes can be combined in any order to implement the processes, or alternate processes. Additionally, individual blocks or steps may be modified or deleted from any of the processes without departing from the spirit and scope of the subject matter described herein. Furthermore, the processes can be implemented in any suitable hardware, software, firmware, or a combination thereof, without departing from the scope of the subject matter described herein. In alternate implementations, other techniques may be included in the processes in various combinations and remain within the scope of the disclosure.

This summary is not intended to give a full description. Implementations are explained in more detail below using a plurality of examples. Although various implementations and examples are discussed here and below, further implementations and examples may be possible by combining the features and elements of individual implementations and examples.

DETAILED DESCRIPTION

Overview

Respective mating surfaces of dies or wafers to be bonded (which may comprise silicon, or another suitable material) often include conductive interconnect structures (which may be metal) embedded within an inorganic dielectric layer (e.g., such as an oxide, nitride, oxynitride, oxycarbide, carbides, nitrocarbides, diamond, diamond like materials, glasses, ceramics, glass-ceramics, and the like) at the bonding surface. The conductive interconnect structures can be arranged at the bonding surface so that conductive interconnect structures from the respective die surfaces are joined during the bonding. The joined interconnect structures form continuous conductive interconnects (for signals, power, heat transmission, mechanical stability, etc.) between the stacked dies.

In general, when direct bonding surfaces containing a combination of a dielectric layer and one or more metal features (e.g., embedded conductive interconnect structures), the dielectric surfaces bond first and the metal of the features expands afterwards, as the metal is heated during annealing. The expansion of the metal can cause the metal from both dies to join into a unified conductive structure (metal-to-metal bond). While both the substrate and the metal are heated during annealing, the coefficient of thermal expansion (CTE) of the metal relative to the CTE of the substrate generally dictates that the metal expands much more than the substrate at a particular temperature (e.g., ~300 C). For instance, the CTE of copper is 16.7, while the CTE of fused silica is 0.55, and the CTE of silicon is 2.56. In some cases, the lower expansion of the dielectric relative to the metal can be problematic for direct bonding stacked dies.

Some embedded conductive interconnect structures 110 may comprise metal pads or features that extend partially or fully into the dielectric substrate 106 below the prepared bonding surface 108 (see FIG. 1B, for example). For instance, some patterned metal features 110 may be about 0.1-5 microns thick (deep). Other conductive interconnect structures 110 may comprise thicker (e.g., deeper) structures, including metal through silicon vias (TSVs) or the like, that may extend partly or fully through the base layer 104 of the substrate 102 and include a larger volume of metal. For instance, a TSV may extend about 3 to 100 microns or more, depending on the thickness of the substrate 102.

Figure 1B:
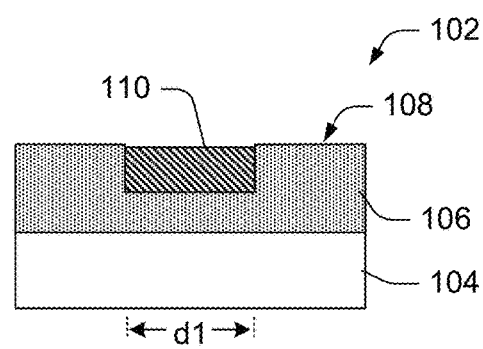

Referring to FIGS. 1A-1B, a representative device die 102 (e.g., die, wafer, substrate, etc.) may be formed using various techniques, to include a base substrate 104 and an insulating or dielectric layer 106. The base substrate 104 may be comprised of silicon, germanium, glass, quartz, a dielectric surface, direct or indirect gap semiconductor materials or layers or another suitable material. The insulating layer 106 is deposited or formed over the substrate 104, and may be comprised of an inorganic dielectric material layer such as oxide, nitride, oxynitride, oxycarbide, carbides, carbonitrides, diamond, diamond like materials, glasses, ceramics, glass-ceramics, and the like as well as combinations thereof.

As shown at FIG. 1B for example, a bonding surface 108 of the device wafer 102 can include conductive features 110, such as traces, pads, and interconnect structures, for example, embedded into the insulating layer 106 and arranged so that the conductive features 110 from respective bonding surfaces 108 of opposing devices can be mated and joined during bonding, if desired. As shown at FIG. 1D for example, the joined conductive features 110 can form continuous conductive interconnects 122 (for signals, power, etc.) between stacked devices 102 and 102'.

In many applications, a damascene process (or the like) may be used to form the embedded conductive interconnect structures 110 in the dielectric bonding layer 106 of the die 102 or wafer. As illustrated at FIG. 1A, the process can include forming a layer of conductive material 112 (for example, a metal such as copper or a copper alloy) within a damascene cavity 114 in the bonding layer 106.

A barrier layer 302 may be deposited within the cavity 114 prior to depositing the conductive material layer 112 (see FIG. 3A), such that the barrier layer 302 is disposed between the conductive features 110 and the insulating layer 106. The barrier layer 302 may be comprised of tantalum, for example, or another conductive material, to prevent or reduce diffusion of the material of the conductive features 110 into the insulating layer 106. Additionally or alternatively, a seed layer 502 may be deposited into the cavity 114 prior to depositing the conductive material layer 112 (see FIG. 5A). The seed layer may be comprised of copper, a copper alloy, or like seed material.

After the conductive features 110 are formed, the exposed surface of the device wafer 102, including the insulating layer 106 and the conductive features 110 can be planarized (e.g., via CMP) to form a flat bonding surface 108. Forming the bonding surface 108 includes finishing the surface 108 to meet dielectric roughness specifications and metallic layer (e.g., copper, etc.) recess specifications, to prepare the surface 108 for direct bonding. In other words, the bonding surface 108 is formed to be as flat and smooth as possible, with very minimal surface topology variance. Various conventional processes, such as chemical mechanical polishing (CMP), dry or wet etching, and so forth, may be used to achieve the low surface roughness. This process provides the flat, smooth surface 108 that results in a reliable bond.

Shown at FIG. 1B, planarizing removes conductive material 112 overfill and the overfill of the barrier layer 302 if present, and exposes the dielectric bonding surface 108 and gives it a very flat topography. As a result, the exposed surface of the embedded conductive interconnect structure 110 may be slightly recessed from the surface 108 of the surrounding dielectric material 106. The bonding surface 108 can be further prepared with cleaning and activation, as desired.

Figure 1C:
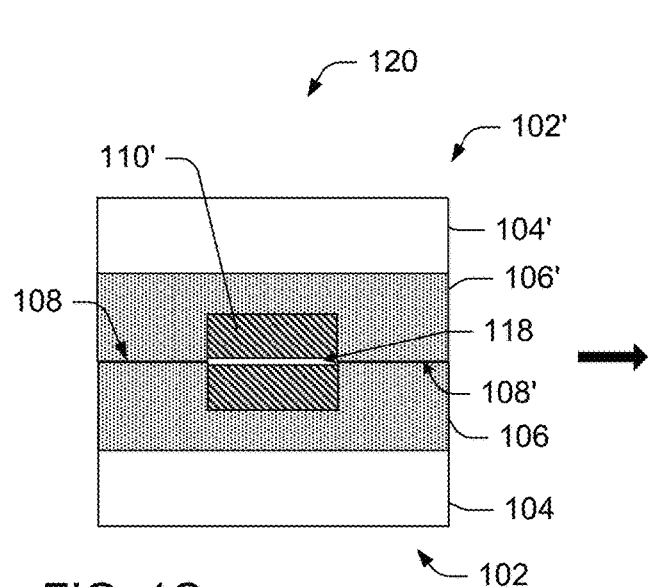
Figure 1D:
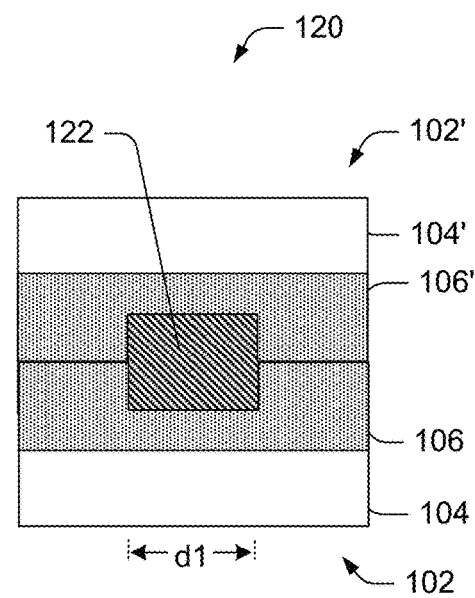

As shown at FIGS. 1C and 1D, the first bonding surface 108 of the die or wafer 102 can then be direct bonded (without adhesive or other intervening materials) to a similarly prepared die or wafer 102' (or other substrate surface) by bringing the two prepared bonding surfaces 108 and 108' into contact with each other, and heating the assembly to a first temperature T1 (e.g., about 150° C.). At this temperature, the dielectric portions (106 and 106') of the bonding surfaces (108 and 108') join in a bond, but the embedded conductive interconnect structures (110 and 110') (e.g., metal features) can be discontinuous, with a gap 118 between them. The assembly 120 can be heated to a second temperature T2 (e.g., about 200° C. or greater) that is greater than the first temperature T1, to cause the embedded conductive interconnect structures (110 and 110') to expand and join with each other, filling the gap 118 and forming a continuous conductive structure 122 or layer between the bonded dies or wafers (102 and 102').

In some applications, it may be desirable to form large diameter metal structures 110, for instance having a width or diameter "d1" of 10 microns to over 100 microns, which include a larger volume of metal. As mentioned above, the metal of these structures 110 expands when heated. In other applications, it may be desirable to form much smaller diameter (or area) metal structures, for instance having a width or diameter "d1" of 2-5 microns or less. These structures include a much smaller volume of metal.

Figure 2A:
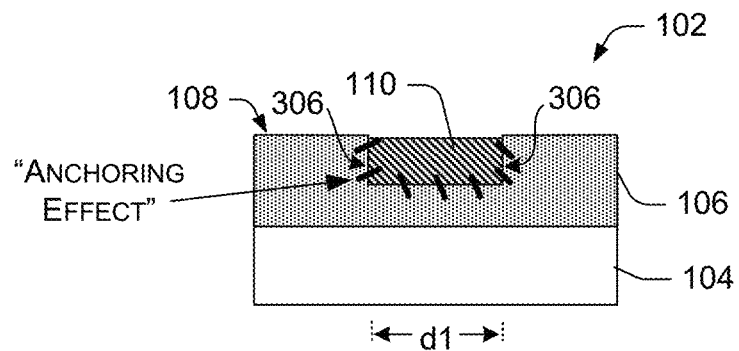
FIGS. 2A-2B show examples of sidewall adhesion with dies or wafers having embedded interconnect structures.
Figure 2B:
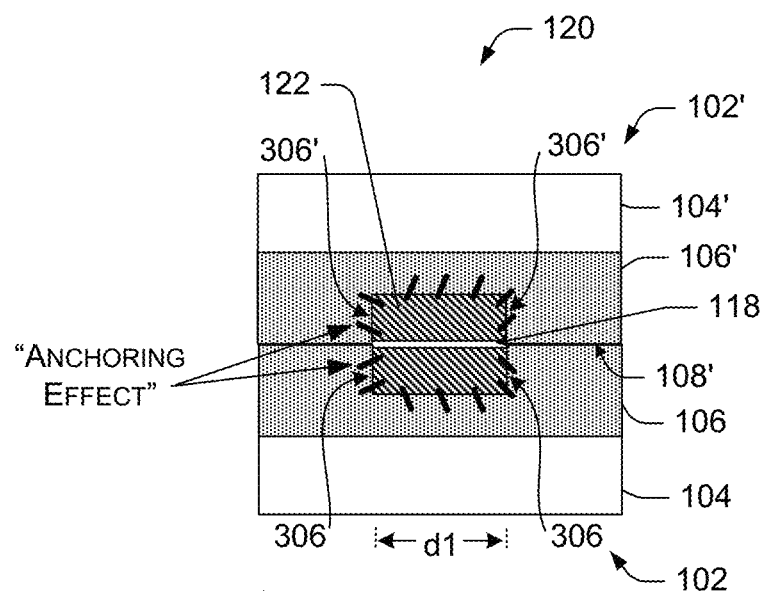

As shown at FIGS. 2A and 2B, good sidewall adhesion (good adhesion between the dielectric cavity 114 sidewalls (306 and 306') and the metal of the features 110 within the cavity 114) is a key part of the damascene process for forming the embedded conductive interconnect structures 110. However, good adhesion of a barrier layer 302, seed layer 502, or the conductive material layer 110 to the sidewalls of the die cavity 114 pins or mechanically anchors the conductive material layer 110 to the sidewalls and can suppress free expansion of the embedded conductive material layer 110 when heated. This can prevent opposing conductive structures 110 and 110' from joining or reliably bonding at common annealing temperatures.

The effective anchoring of the conductive material layer 110 to the dielectric layer sidewalls of the cavity 114 means a higher bonding temperature is needed to expand the opposing embedded conductive interconnect structures 110 and 110' within the confined gap 118 so that they bond together. Because of the anchoring effect (shown by the diagonal hash lines in the illustrations), the smaller the diameter or width "d1" of the embedded conductive interconnect structures 110, the higher the bonding temperature needed to bond the opposing structures 110 and 110'. As an example, opposing conductive pads 110 and 110' having a width "d1" of 15 microns may be bonded at under 220° C., however, a temperature of 340° C. or even higher may be required to bond conductive features 110 and 110' with width "d1" of 3 microns or less.

Example Embodiments

Figure 3A:
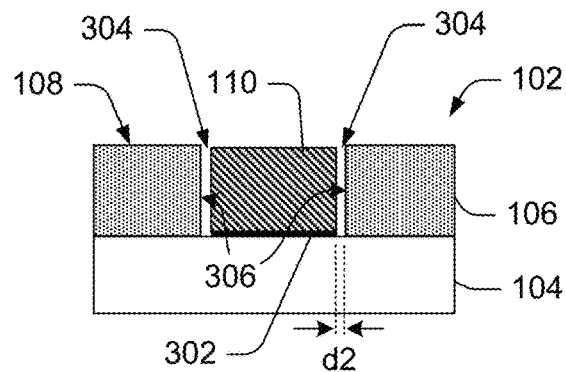
FIGS. 3A-3C show cross-section profile views of examples of microelectronic assemblies with laterally unconfined interconnect structures, according to various embodiments.
Figure 3B:
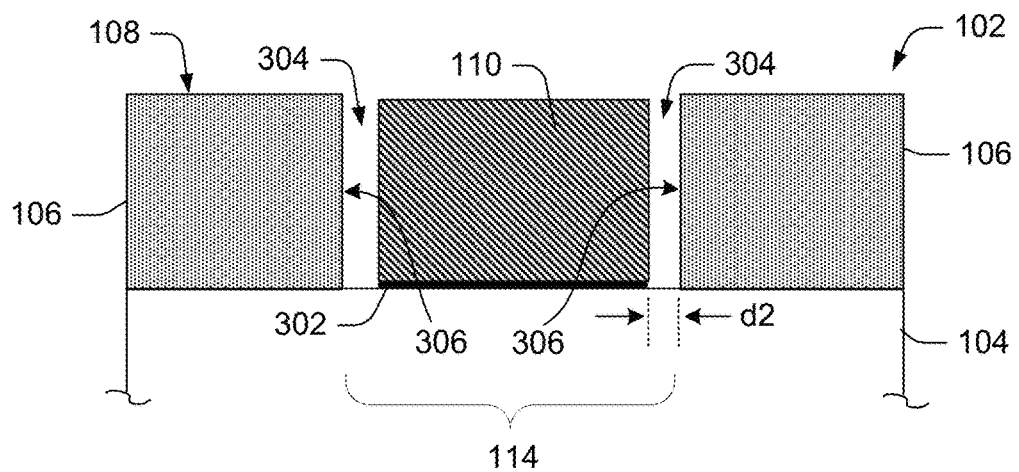

In various embodiments, techniques may be employed to mitigate the anchoring effects of cavity sidewall adhesion on an embedded conductive interconnect structure 110, and to allow a lower annealing temperature to be used to join opposing conductive interconnect structures (110 and 110'). Referring to FIGS. 3A and 3B, in various embodiments, a vertical gap 304 (approximately "d2"=10 to 2000 nanometers wide) may be disposed between the conductive material of the interconnect structure 110 and the sidewall 306 of the cavity 114 to laterally unpin the conductive structure 110 and allow uniaxial expansion of the conductive material. For instance, as shown in the close-detail illustration of FIG. 3B, in the embodiments, the embedded conductive structure 110 is physically decoupled from the sidewall 306 (or a section of the sidewall 306) of the cavity 114 by the vertical gap 304. In various embodiments, the vertical isolation gap 304 may partially or fully surround a perimeter of the conductive interconnect structure 110.

In one embodiment, as shown at FIG. 3B, the vertical gap 304 is disposed between the conductive material of the embedded structure 110 and the sidewall 306 of the cavity 114 (e.g., dielectric material 106 that surrounds the embedded conductive structure 110). A barrier or adhesion layer 302 may be disposed in the cavity 114, below the conductive structure 110 for example, and/or at the sidewalls 306. (In various examples, the barrier layer 302 may be comprised of conductive or insulative materials, for example silicon nitride or the like.)

Figure 3C:
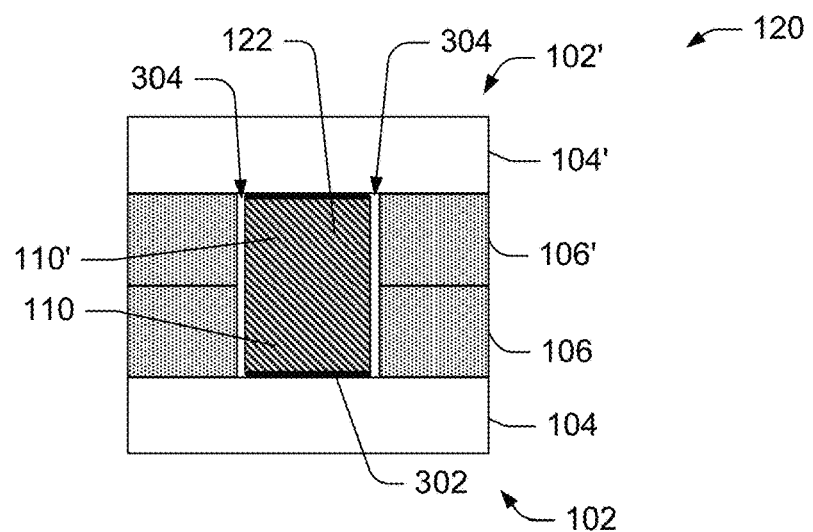

As shown at FIG. 3C, an assembly 120 may be formed by stacking and bonding at least two such dies 102 and 102' or wafers. Using the disclosed vertical isolation gap 304, the conductive structures 110 and 110' can be bonded at a lower temperature T3 (e.g., approximately 150° C.) than the second temperature T2. This is because the vertical gap 304 provides relief to the conductive structures 110 and 110' from the anchoring effects of the cavity sidewalls 306, making the conductive structures 110 and 110' laterally unconfined within the cavity 114, and allowing the conductive material to freely expand.

Figure 4A:
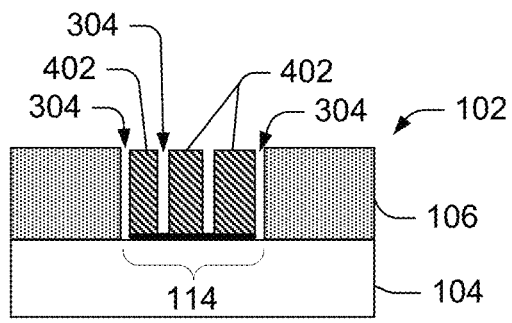
FIGS. 4A-4C show cross-section profile views of examples of microelectronic assemblies with laterally unconfined interconnect structures, according to various other embodiments.
Figure 4B:
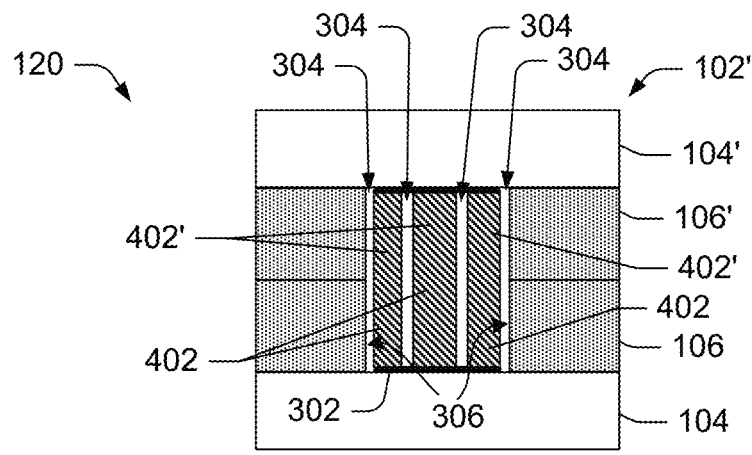
Figure 4C:
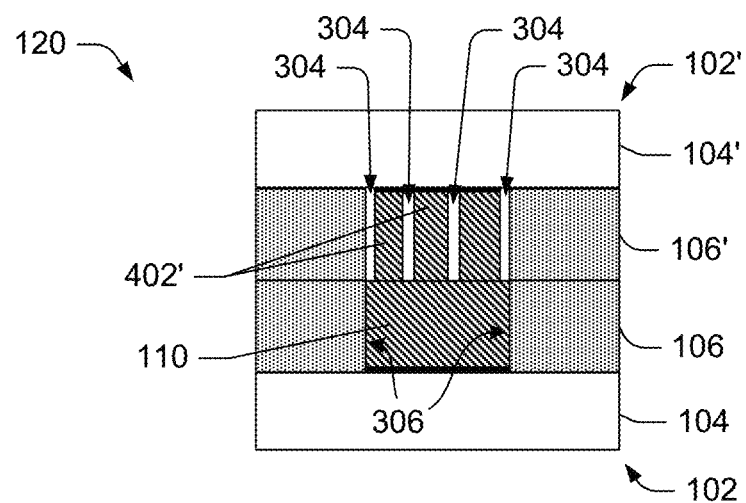

Referring to FIGS. 4A-4C, in some embodiments, the embedded conductive structure 110 may comprise multiple structures 402 within a common damascene cavity 114. The multiple structures 402 can also be decoupled from the cavity sidewalls 306 using the vertical isolation gaps 304 as described. The multiple structures 402 may also be separated from each other by vertical air gaps 304, or vertical gaps 304 filled with compressive materials, such as porous materials, or the like. A die 102 with multiple conductive structures 402 may be bonded to a similar die 102' having opposing multiple conductive structures 402' as shown at FIG. 4B or may be bonded to a die 102 having a single conductive structure 110 as shown at FIG. 4C, which may or may not include one or more vertical isolation gaps 304 at a side edge of the conductive structure(s) 110 or 402, or a sidewall 306 of the cavity 114.

In either case, the use of the vertical isolation gaps 304 between the side edges of the conductive structures 110 or 402 and the sidewalls 306 of the cavity 114 allows a lower bonding temperature T3 (e.g., approximately 150° C.) to be used to bond the conductive structures 110 and/or 402, where the bonding temperature T3 is lower than the second temperature T2. In various embodiments of the disclosure, a portion of a vertical isolation gap 304 in close proximity to the bonding surface 108 (or at any point along the length of the isolation gap 304) may be closed or partially closed (e.g., blocked or partially blocked), forming a blind or partially blind embedded isolation gap 304.

In one embodiment, the conductive structures 402 may comprise columnar grain structures. The columnar grain is oriented in the vertical direction (away from the bottom barrier layer 302). The grain boundary of the columnar grain structure may be selectively etched to form a blind isolation gap 304 within the conductive structures 402. The width of the etched grain boundary isolation gap 304 may range from between 3 to 100 nm and from between 5 to 50 nm. The depth of the isolation gap 304 may vary between 2 to 80% of the thickness of the conductive structure 402 and between 5 to 55% of the thickness of the conductive structure 402.

Figure 5A:
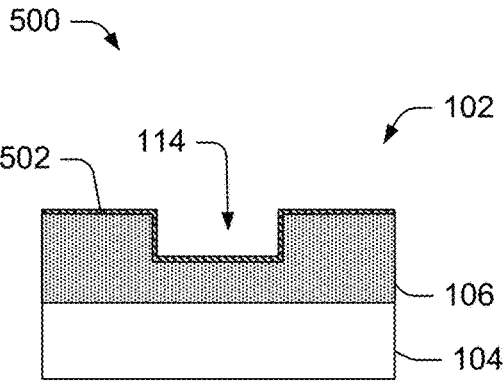
FIGS. 5A-5F show a graphical flow diagram illustrating an example process of forming microelectronic assemblies with laterally unconfined interconnect structures, according to an embodiment.
Figure 5B:
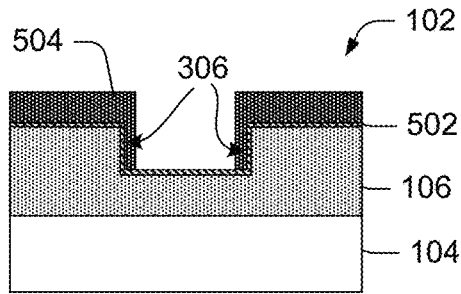
Figure 5C:
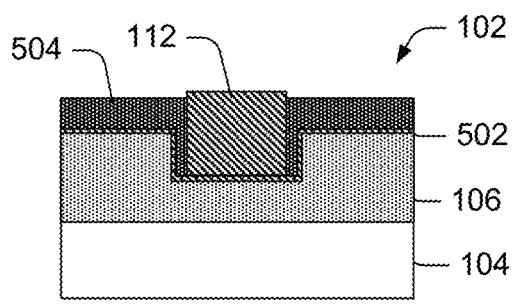
Figure 5D:
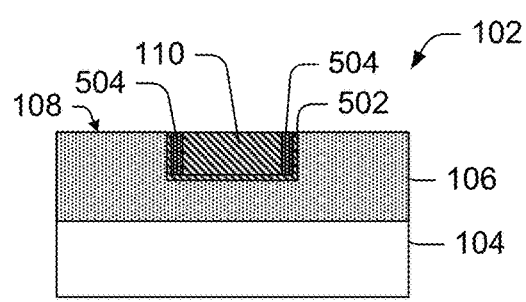
Figure 5E:
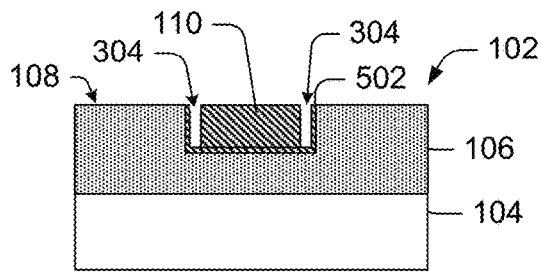
Figure 5F:
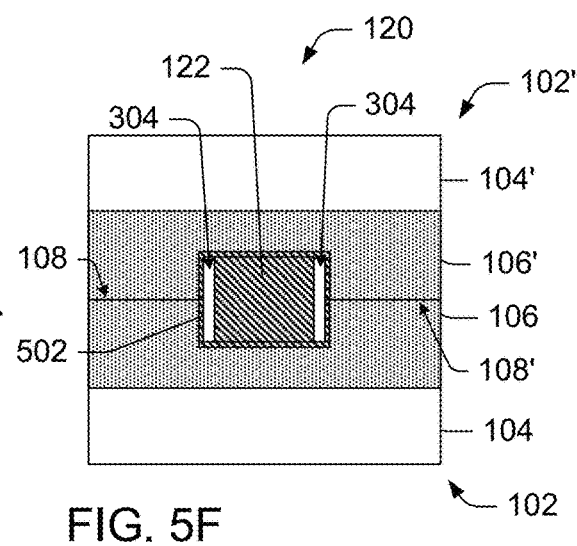
Figure 6A:
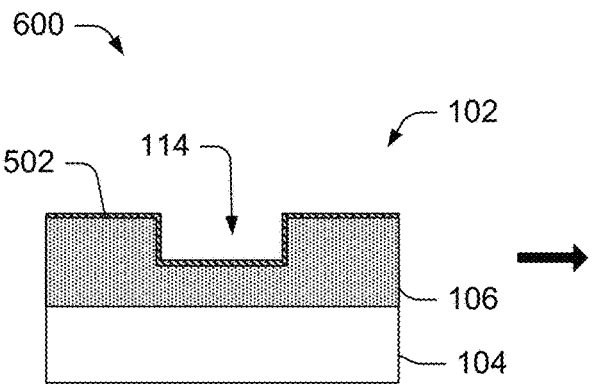
FIGS. 6A-6F show a graphical flow diagram illustrating an example process of forming microelectronic assemblies with laterally unconfined interconnect structures, according to another embodiment.

FIGS. 5A-5F illustrate an example process 500 for forming an embedded conductive structure 110 with vertical isolation gaps 304 and FIGS. 6A-6F illustrate an example process 600 for forming multiple embedded conductive structures 402 with vertical isolation gaps 304, according to various embodiments. For example, as shown at FIGS. 5A and 6A, a barrier layer 302 and/or a seed layer 502 can be deposited within a damascene cavity 114 within a given substrate 102 or dielectric layer 106. The barrier layer 302 may comprise a conductive material, such as tungsten, an alloy of tungsten, a nickel alloy, tantalum or titanium and their various alloys, for example TaN/Ta or Ta/TaN, Ti/TiN, cobalt, CoP, NiP, CoWP, CoP/NiP or the like, or an insulating material such as SiO2, SiC, SiN, SiC/SiO2, SiN/SiO2, SiN/polysilicon, inorganic dielectric, organic dielectric, or the like.

A seed layer 502 may include copper or a copper alloy, for example. In some embodiments, the seed layer 502 may include a copper layer having a predetermined grain texture orientation, such as {111}, for example. Building the conductive structure 110 (or 402) on such a seed layer 502 can result in the embedded conductive structure 110 (or 402) having the predetermined (e.g., {111}) grain texture orientation. The predetermined (e.g., {111}) grain texture orientation can be instrumental in lowering the annealing temperature even further for conductor-to-conductor direct bonding. Hence, a conductive structure 110 (or 402) comprised of a highly oriented metal grain texture {111} and also having a vertical gap 304 decoupling the conductive structure 110 (or 402) from the bulk of the dielectric layer 106 receives the combined benefits of both features (i.e., a highly oriented texture and an isolation gap 304 or gaps) to allow bonding of opposing conductive structures 110' (or 402') at a temperature T4 (e.g., 80-150° C.) that is lower than T3.

Figure 6B:
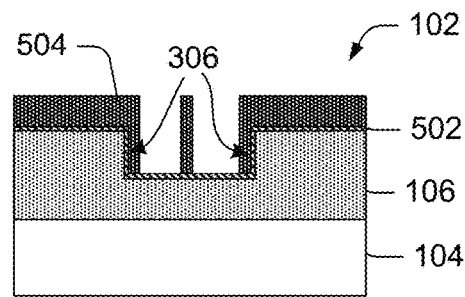

As shown at FIGS. 5B and 6B, a resist layer 504 is covered and patterned over the barrier 302 and/or seed layer 502. When forming multiple conductive structures 402 within a single cavity 114, the resist layer 504 can be patterned within the cavity 114 to form the multiple structures 402, as shown at FIG. 6B. In either case, the resist layer 504 may be disposed at the sidewalls 306 of the cavity 114 to prevent the conductive layer 112 from being deposited against the sidewalls 306 when it is deposited through the resist mask 504.

Figure 6C:
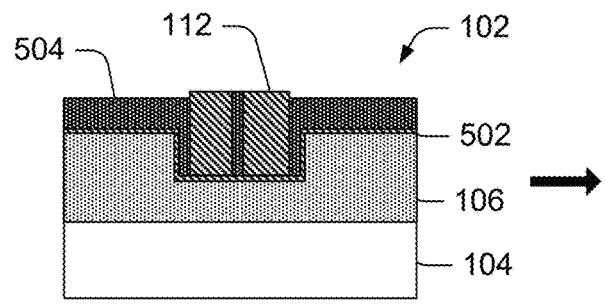
Figure 6D:
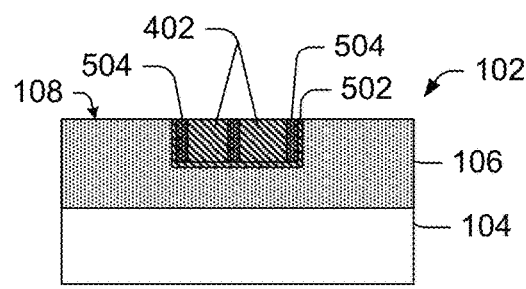
Figure 6E:
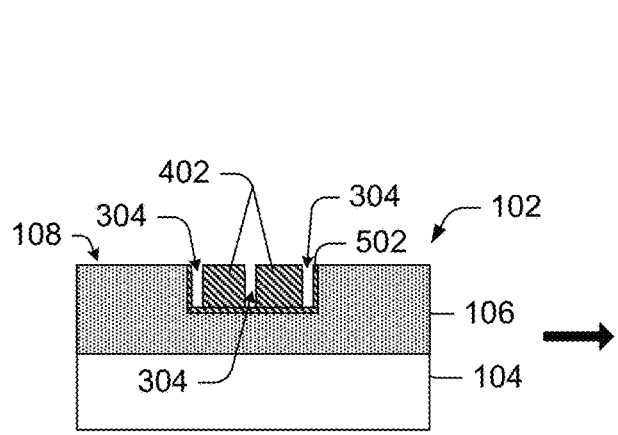

The conductive material 112 is formed to overfill the cavity 114, as shown at FIGS. 5C and 6C. A conductive material 112 may include copper or a copper alloy, for example. The overfill portion of the conductive material 112 and any other unwanted materials are removed as the top surface of the die 102 or wafer is planarized (using chemical-mechanical polishing (CMP) or the like) to form the bonding surface 108, as shown at FIGS. 5D and 6D. When the resist 504 is removed, as shown at FIGS. 5E and 6E, vertical isolation gaps 304 remain in its place.

In the examples shown, the vertical gaps 304 are disposed between the embedded conductive structure 110 or 402 and the barrier layer 302 and/or seed layer 502 that is disposed on the cavity sidewalls 306. In other embodiments, other layers may also be present on the cavity sidewalls 306, or no layers may be present. Whether a single conductive structure 110 is formed (FIG. 5E) or multiple conductive structures 402 are formed (FIG. 6E) a vertical isolation gap 304 (that may be comprised of air, for example) can be present between the conductive structure(s) 110 or 402 and the sidewalls 306 of the cavity 114.

Figure 6F:
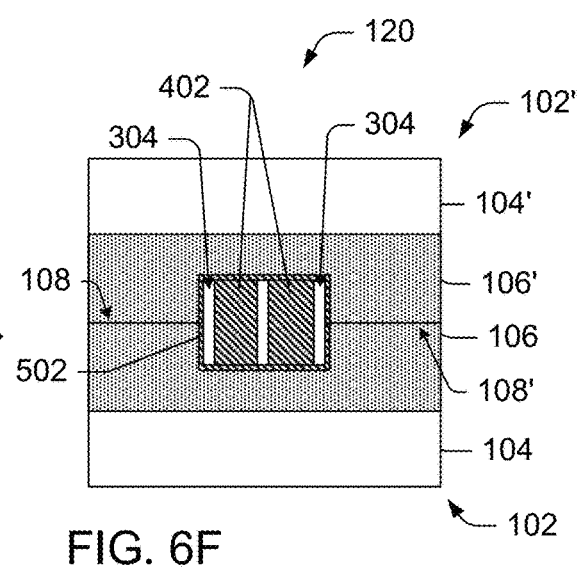

The bonding surface 108 of the die 102 or wafer may be ready for direct bonding to another like die 102' or wafer, or to some other prepared substrate, as shown at FIGS. 5F and 6F. As illustrated, the vertical isolation gaps 304 may also be present on an assembly 120 formed by the bonding. In some cases, the expansion of the conductive material of the contacts 110 may partially or fully fill the vertical isolation gaps 304 during annealing.

Referring to FIGS. 7A-7D and 8A-8D, in some cases the damascene process may be performed without depositing a barrier layer 302 into the cavity 114 prior to forming the conductive material 112 layer. In example processes 700 and 800, a barrier layer 302 may be added after forming the conductive structures 110 and/or 402 and vertical isolation gaps 304.

Figure 7A:
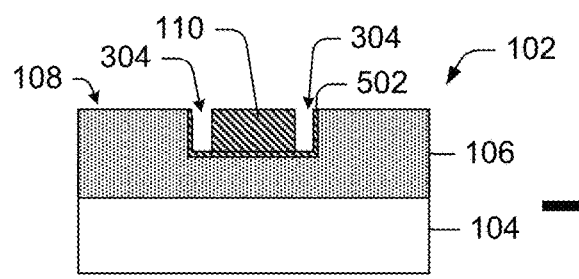
FIGS. 7A-7D show a graphical flow diagram illustrating an example process of forming microelectronic assemblies with laterally unconfined interconnect structures, according to another embodiment.
Figures 8A, 8B:
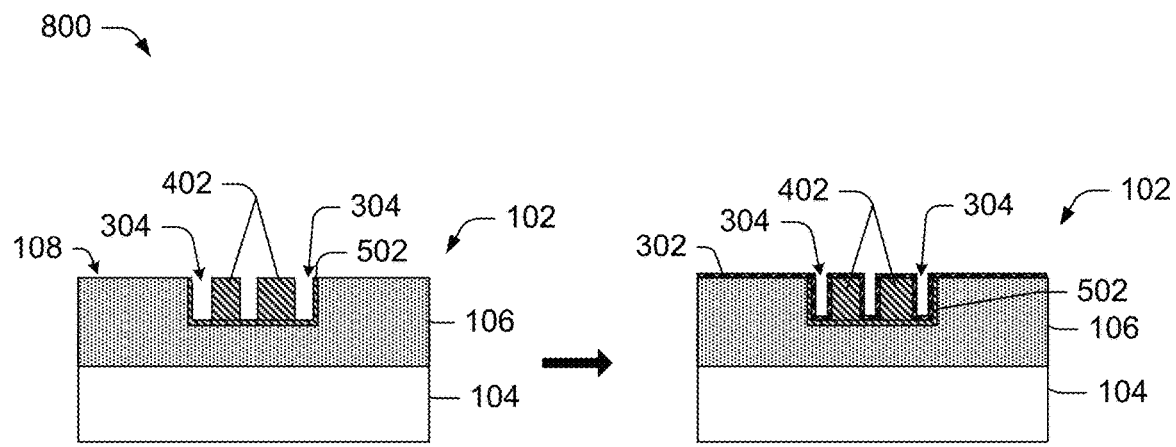
FIGS. 8A-8D show a graphical flow diagram illustrating an example process of forming microelectronic assemblies with laterally unconfined interconnect structures, according to another embodiment.

For instance, referring to FIGS. 7A and 8A, once the resist layer 504 is removed after forming the conductive material layer 112 and the bonding surface 108 is planarized, the vertical isolation gaps 304 are revealed between the laterally unconfined conductive structure(s) 110 and/or 402 and the seed layer 502 within the cavity 114.

Figure 7B:
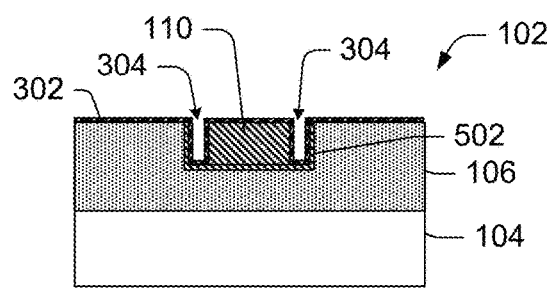

Referring to FIGS. 7B and 8B, a barrier layer 302, which may be conductive or insulative as discussed above, can be deposited over the conductive structure(s) 110 and/or 402 and within the vertical isolation gaps 304. Unwanted materials on the bonding surface 108, including excess barrier layer 302 material may be removed by planarization, polishing, selective etching, or the like.

In alternate embodiments, a suitable barrier layer 302 may be coated on the dielectric layer 106 within the cavity 114 if desired, prior to forming the conductive structure(s) 110 and/or 402. The barrier layer 302 can be coated with the seed layer 502 in some cases (and sometimes the barrier layer 302 may also comprise the seed layer 502). After coating and patterning the resist layer 504, the conductive layer 112 can be formed by electrolytic or electroless plating methods, for example. The resist layer 504 can be stripped from the surface of the seed layer 502. A second barrier layer 302 is then coated on the substrate 102 (as described above), covering the inside walls of the revealed vertical isolation gaps 304 and the newly formed conductive layer 112.

Figure 7C:
Figure 7C:
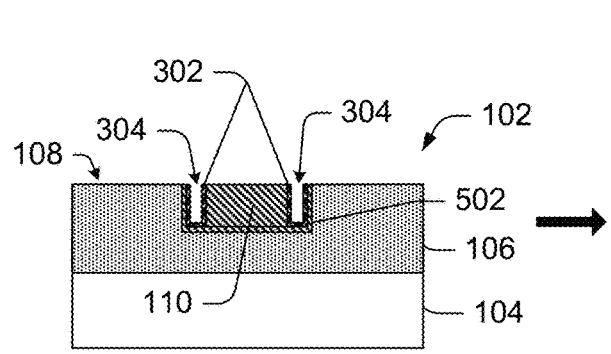
Figures 8C, 8D:
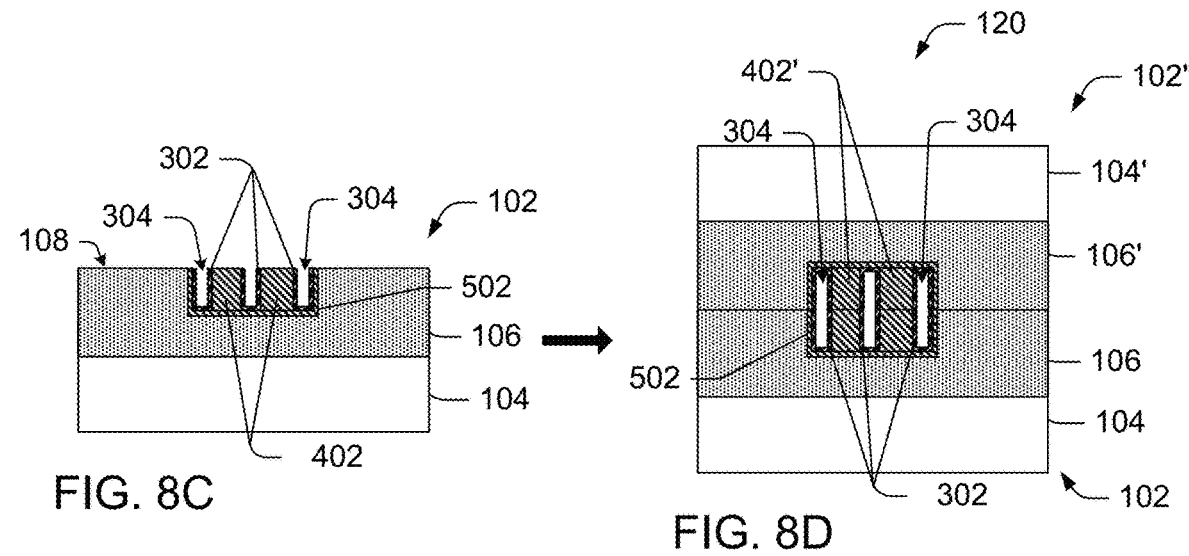

CMP methods may be applied to remove all unwanted materials on the surface 108 of the dielectric layer 106 and the conductive layer 112 to form a dielectric bonding surface 108 and conductive structure 110 with a bonding surface, as shown at FIGS. 7C and 8C. A vertical isolation gap 304 exists between the sidewalls of the conductive structure 110 in the cavity 114 and the conductive seed layer 502 on the sidewall 306 of the cavity 114.

Figure 7D:
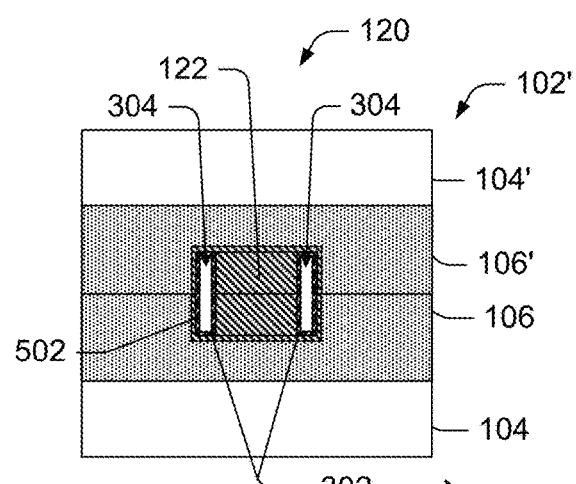

The thin barrier layer 302 may be deposited by PVD methods, ALD methods, electrolytic or electroless deposition methods, a plasma dielectric layer coating method, or the like. The barrier layer 302 remains within the vertical isolation gaps 304, disposed on the sides of the conductive structure 110 and on the sidewalls 306 of the cavity 114 (which may be coated with the seed layer 502). The bonding surface 108 of the die 102 or wafer may be ready for direct bonding to another like die 102' or wafer, or to some other prepared substrate. As illustrated at FIGS. 7D and 8D, the vertical isolation gaps 304, lined with barrier layer 302 material, may also be present on an assembly 120 formed by the bonding.

Figure 9A:
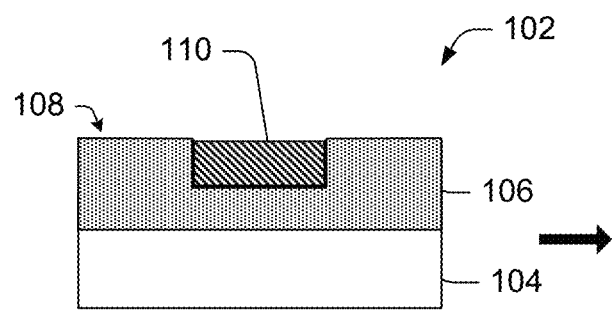
FIGS. 9A-9D show a graphical flow diagram illustrating an example process of forming microelectronic assemblies with laterally unconfined interconnect structures, according to another embodiment.

Referring to FIGS. 9A-9D, another example process 900 for forming vertical isolation gaps 304 for a laterally unconfined embedded conductive structure 110 (or 402) is shown. In the example, as shown at FIG. 9A, a damascene process is used to form an embedded conductive structure 110 (or 402) as discussed above. A barrier layer 302 and/or a seed layer 502 may be deposited within the damascene cavity 114 prior to forming the conductive layer 112 and structure 110 (or 402).

Figure 9B:
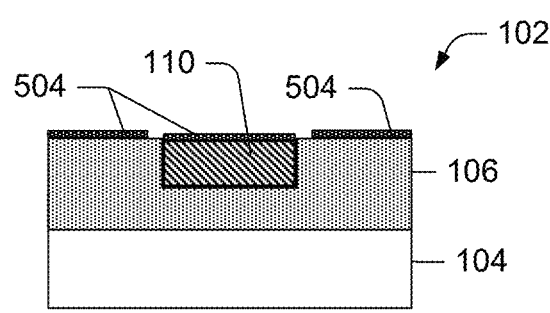
Figure 9C:
Figure 9C:
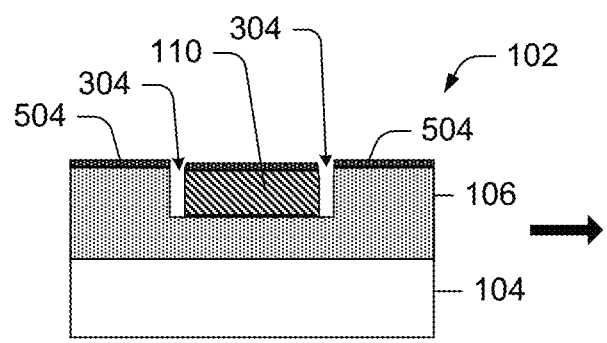
Figure 9D:
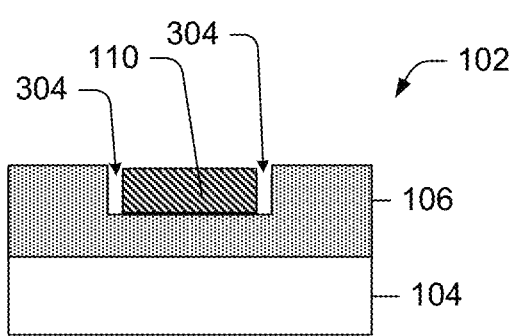

After planarization, the dielectric portion of the bonding surface 108 may be patterned with a resist or other suitable mask 504, as shown at FIG. 9B. Portions of the dielectric layer 106 are selectively removed based on the mask 504, including portions of the dielectric layer 106 that abut the embedded conductive structure 110 (or 402). The dielectric portions may be removed using dry or wet selective etch chemistry, or the like. Removing these portions forms the vertical isolation gaps 304 that partially or fully surround the structure 110. The vertical isolation gaps 304 may be left as air gaps, or they may be filled with a compressible material such as a fill, an epoxy, or the like. The mask 504 is removed to reveal the bonding surface 108 of the die 102 or wafer.

Figure 10A:
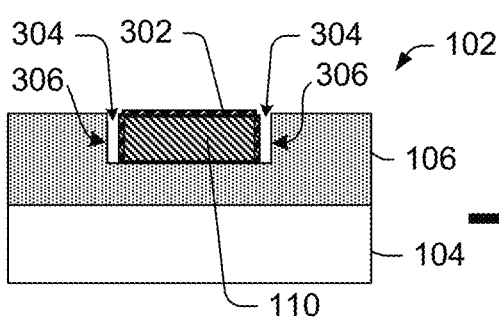
FIGS. 10A-10D show graphical flow diagrams illustrating example processes of forming microelectronic assemblies with laterally unconfined interconnect structures, according to various embodiments.
Figure 10B:
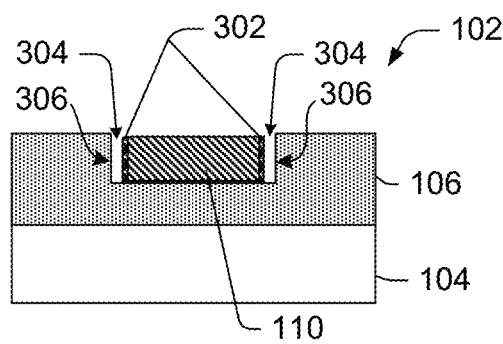

As shown at FIGS. 10A-10B, a barrier layer 302 (which may be conductive or insulative as discussed above) may be added to the conductive structure 110 (or 402) after forming the vertical isolation gaps 304. The barrier layer 302 can be deposited on the sides of the conductive structure 110 or 402 (and may also be deposited on the top surface of the structure 110 or 402). After selective removal of the barrier layer 302 from the top surface of the conductive structure 110 or 402, as shown at FIG. 10B (by CMP, etch, or other methods), the barrier layer 302 remains on the sides of the embedded structure 110 (or 402). In the example, the vertical isolation gap 304 is disposed between the barrier layer 302 of the conductive structure 110 and the dielectric sidewalls 306 of the cavity 114.

Figure 10C:
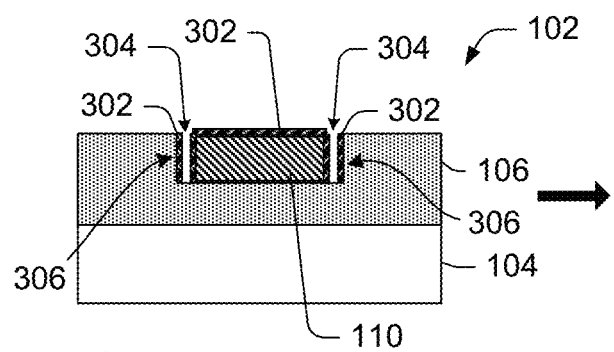
Figure 10D:
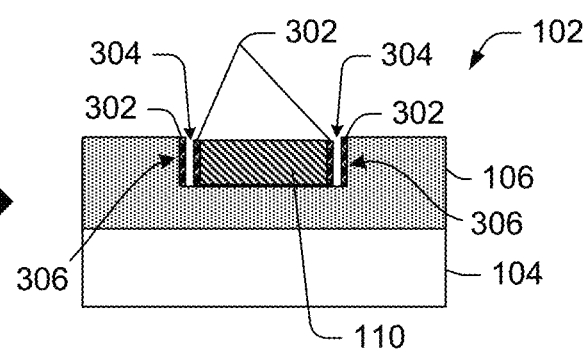

Alternately, as shown at FIGS. 10C-10D, the barrier layer 302 can be deposited over the conductive structure 110 (or 402) and within the vertical isolation gaps 304, coating both inner and outer sides of the vertical gaps 304. After selective removal of the barrier layer 302 from the bonding surface 108, as shown at FIG. 10D (at the conductive structure 110 and the dielectric 106 surrounding the structure 110), the barrier layer 302 remains on the sides of the structure 110 (or 402) and on the sides 306 of the cavity 114. In the example, the vertical isolation gap 304 is disposed between the barrier layer 302 on the conductive structure 110 and the barrier layer 302 on the dielectric sidewalls 306 of the cavity 114.

Figure 11A:
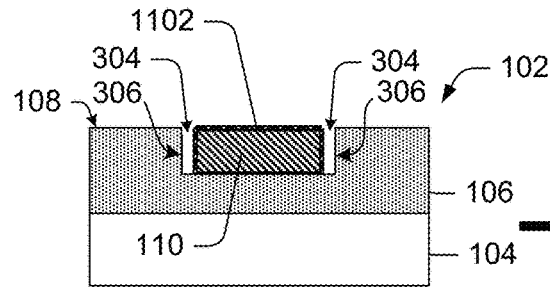
FIGS. 11A-11D show graphical flow diagrams illustrating example processes of forming microelectronic assemblies with laterally unconfined interconnect structures, according to various embodiments.
Figure 11B:
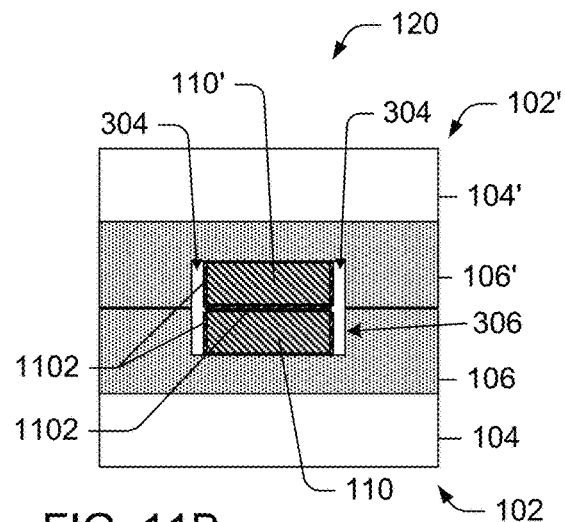
Figure 12A:
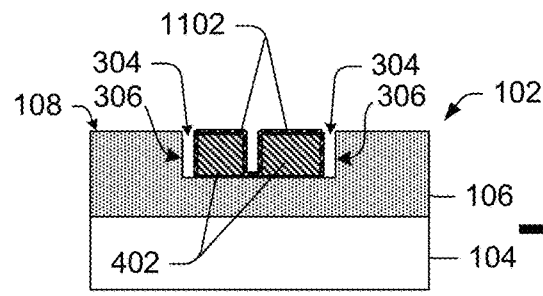
FIGS. 12A-12D show graphical flow diagrams illustrating example processes of forming microelectronic assemblies with laterally unconfined interconnect structures, according to various embodiments.
Figure 12B:
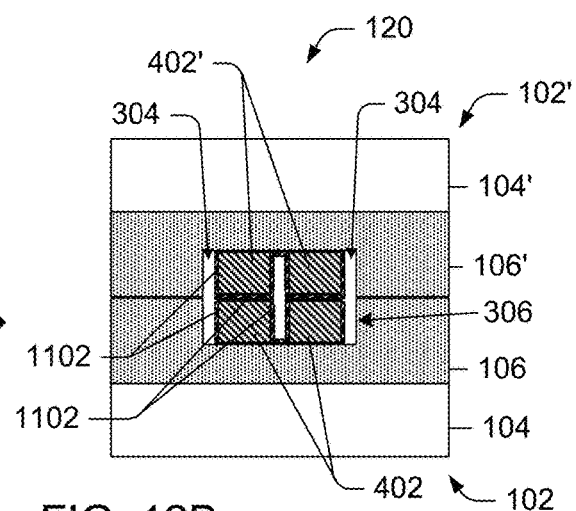

Another alternative embodiment is shown at FIGS. 11A-11B and FIGS. 12A-12B, where a bondable first layer 1102, comprising a very thin coating of indium and/or indium alloys, gallium and/or gallium alloys, or the like, is deposited onto the embedded conductive structure 110 (or 402) after forming the structure 110 (or 402) and the vertical isolation gaps 304 as described above (see FIGS. 11A and 12A). After bonding surface 108 planarization, the bondable first layer 1102 remains on the sides of the structure 110 (or 402), so that the vertical isolation gap 304 is disposed between the bondable first layer 1102 on the conductive structure 110 (or 402) and the dielectric sidewalls 306 of the cavity 114 (or conductive seed layer 502 on the sidewalls 304). In the embodiment shown at FIG. 12A, one or more vertical isolation gaps 304 are also disposed between layers of the bondable first layer 1102 on the conductive structures 402.

The bonding surface 108 of the die 102 or wafer may be ready for direct bonding to another like die 102' or wafer, or to some other prepared substrate. As illustrated at FIGS. 11B and 12B, the vertical isolation gaps 304, and the first bondable layer 1102 lining the structure 110 (or 402), may also be present on an assembly 120 formed by the bonding. In this example, the bonding of the opposing conductive structures 110 and 110' (or 402 and 402') may be performed at a temperature lower than 150° C. and preferably at a temperature lower than 100° C.

Figure 11C:
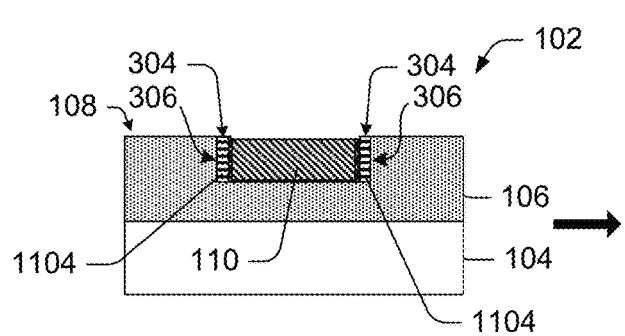
Figure 11D:
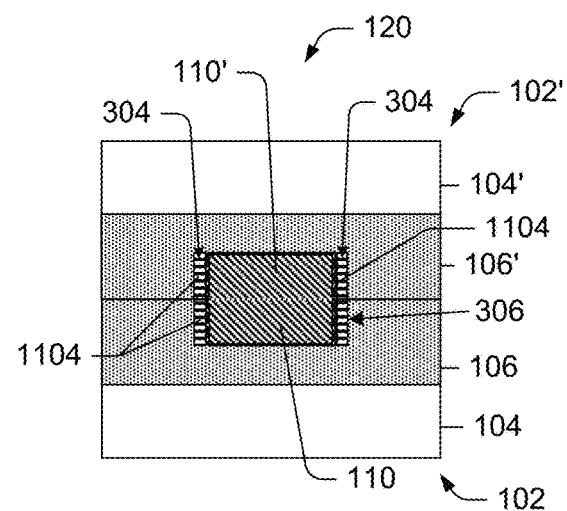
Figure 12C:
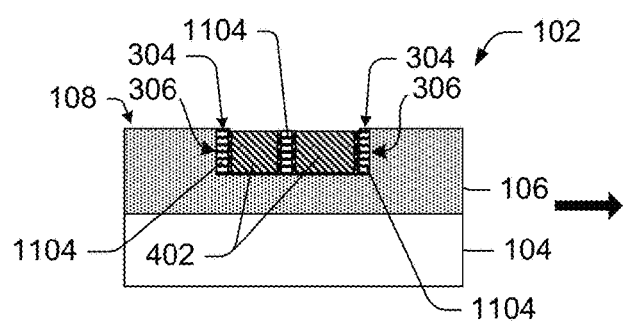
Figure 12D:
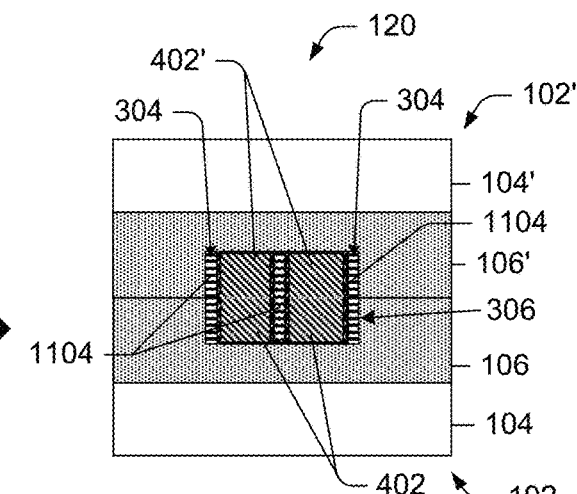

A further embodiment is also shown at FIGS. 11C-11D (for single structure embodiments) and FIGS. 12C-12D (for multi-structure embodiments). In an example, the vertical isolation gaps 304 as described in any of the prior examples and embodiments may be fully or partially filled with a fill material 1104. For example, the fill material 1104 may comprise a porous polymeric material or other porous inorganic material or compound. Alternately, the fill material 1104 may comprise a porous organic material, for example, a porous phenolic or epoxy, or porous inorganic materials such as silicon nitride, diamond, aluminum oxide, silicon oxide, and so forth. In the example, the vertical isolation gap 304 with the fill material 1104 is disposed between the conductive structure 110 (or 402) (which may be lined with a barrier layer 302 or other suitable layer) and the dielectric sidewalls 306 of the cavity 114 (or conductive seed layer 502 on the sidewalls 306). As illustrated, the vertical isolation gaps 304, fully or partially filled with the fill material 1104, are also present on an assembly 120 formed by bonding to a like die 120' or wafer.

Figure 13A:
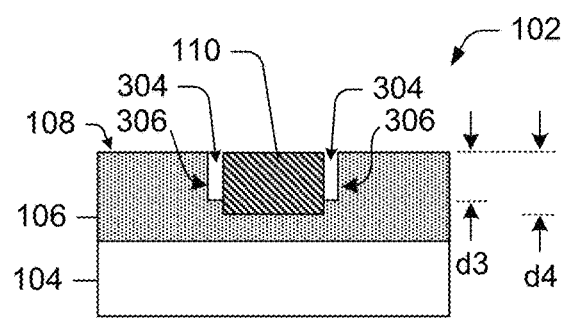
FIGS. 13A and 13B show cross-section profile views of example microelectronic assemblies with laterally unconfined interconnect structures, according to various embodiments.
Figure 13B:
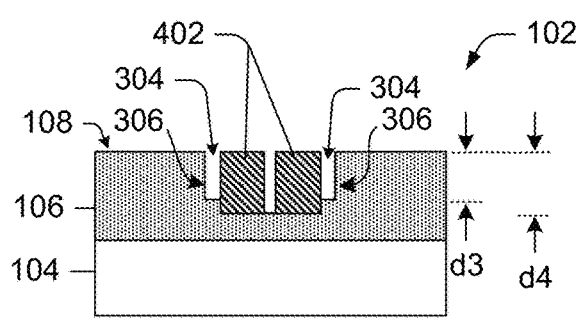

As shown at FIGS. 13A-13B, in various examples, a vertical isolation gap 304 may have varying depths ("d3"), to include the depth ("d4") of the embedded conductive structure 110 or 402, or a depth greater or lesser than the depth ("d4") of the embedded conductive structure 110 or 402. In some examples, the depth ("d3") of the vertical gap 304 is greater than 20% of the thickness or depth ("d4") of the embedded conductive structure 110 or 402. In other examples, the depth ("d3") of the vertical gap 304 is less than 20% of the thickness or depth ("d4") of the embedded conductive structure 110 or 402, for example when the conductive structure 110 or 402 comprises a TSV.

Figure 13C:
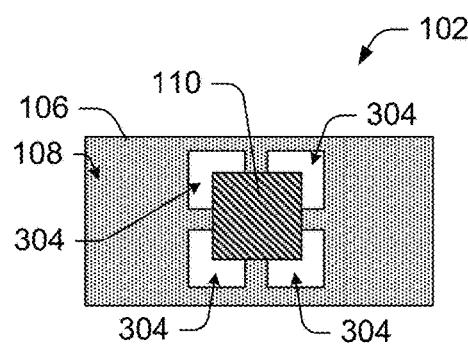
FIGS. 13C and 13D show top plan views of example microelectronic assemblies with laterally unconfined interconnect structures, according to various embodiments.
Figure 13D:
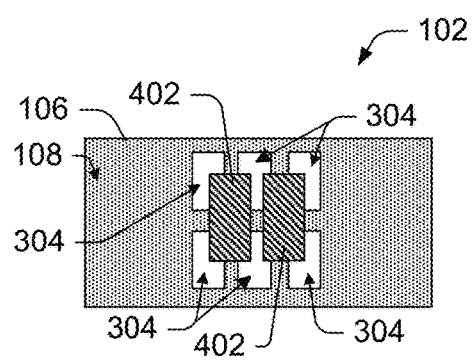

FIGS. 13C-13D show top (plan) views of example dies 102 or wafers with embedded conductive structures 110 or 402. As shown at FIGS. 13C and 13D, in various examples a vertical isolation gap 304 may, but need not fully surround the perimeter of an embedded conductive structure 110 or 402. For example, a vertical isolation gap 304 may surround a portion of the perimeter or multiple vertical isolation gaps 304 may surround multiple portions of the perimeter of the structure 110 or 402 to laterally un-confine the structure 110 or 402. In an example, the vertical isolation gaps 304 may surround more than 70% of the perimeter of the embedded conductive structure 110 or 402. In other examples, the vertical isolation gaps 304 may surround less than 70% of the perimeter of the embedded conductive structure 110 or 402.

Figure 14A:
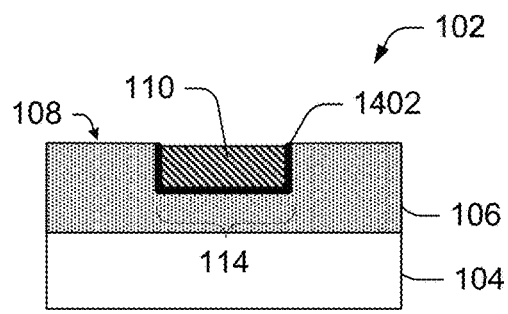
FIGS. 14A-14D show cross-section profile views of examples of microelectronic assemblies with laterally unconfined interconnect structures, according to various embodiments.
Figure 14B:
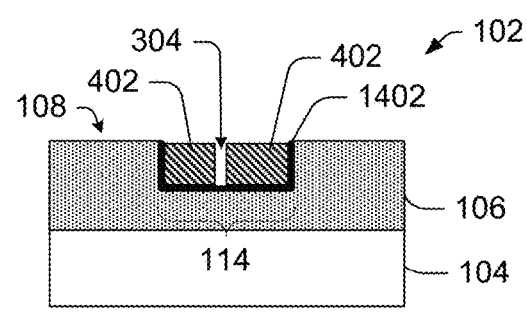

In an alternate embodiment, as shown at FIGS. 14A and 14B, the cavity 114 may be filled with a predetermined barrier layer 1402 having an anisotropic adhesive characteristic. For instance the predetermined barrier layer 1402 can be strongly bonded to the conductive material of the embedded structure 110 or 402 and weakly bonded to the dielectric material 106 of the die 102 or wafer. The embedded conductive structure 110 or 402 may be fully or partially surrounded (e.g., at least at portions of the sides of the structure 110 or 402) by the adhesive barrier layer 1402. In various examples, the adhesive barrier layer 1402 may be comprised of a material having anisotropic lateral adhesive properties, such as $Ta_2N$, or the like. In an example, the adhesive barrier layer 1402 may be deposited within the damascene cavity 114 prior to forming the conductive structure 110 or 402.

As shown at FIG. 14B, the adhesive barrier layer 1402 may also be used with multiple conductive structures 402 within the cavity 114, which may be separated by vertical isolation gaps 304. In one example, the adhesive barrier layer 1402 may have a thickness of 0.02-0.5 microns, or may be thinner (on the order of 50 nanometers, for instance) for a 2 micron thick (deep) conductive structure 110 or 402.

Figure 14C:
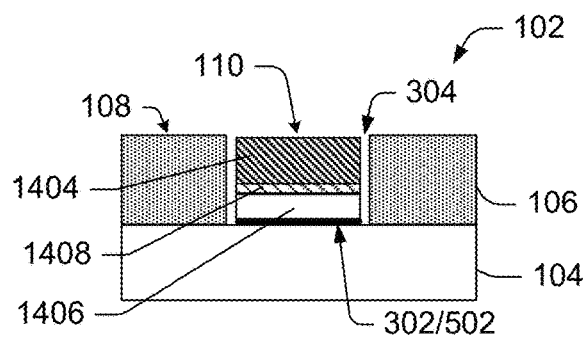
Figure 14D:
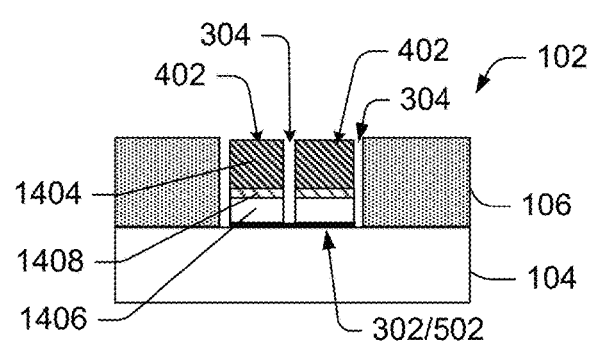

FIGS. 14C and 14D illustrate an alternate embodiment where the embedded conductive structure 110 and/or multiple structures 402 are comprised of multiple layers 1404 and 1406, comprising different or similar conductive materials. In various embodiments, the structure(s) 110 and/or 402 can be comprised of two or more materials 1404, 1406, which may be separated by a barrier layer 1408 in some examples. The conductive materials 1404 and 1406 may comprise copper, a copper alloy, nickel or nickel alloy, gold, a gold alloy, or the like. The barrier layer 1408 may comprise a conductive material, such as tungsten, an alloy of tungsten, a nickel alloy, tantalum or titanium and their various alloys, for example TaN/Ta or Ta/TaN, Ti/TiN, cobalt, CoP, NiP, CoWP, CoP/NiP or the like. While two conductive layers (1404 and 1406) and one barrier layer (1408) is illustrated, additional conductive layers and/or barrier layers are also within the scope of the disclosure.

As an example, after lining the damascene cavity 114 with a barrier layer 302 and/or a seed layer 502, a resist mask 504 can be deposited within the cavity 114 to define the vertical isolation gaps 304 (and the multiple structures 402 as shown at FIG. 14D, if applicable). The multiple layers 1404, 1406 of conductive materials may be deposited one layer at a time through the mask 504, with a barrier layer 1408 in between layers 1404, 1406 if desired.

After all conductive layers 1404, 1406 are deposited, the bonding surface 108 is planarized and the resist 504 is removed, revealing the vertical isolation gaps 304 (and the multiple structures 402 if applicable). The bonding surface 108 of the die 102 or wafer may be ready for direct bonding to another like die 102' or wafer, or to some other prepared substrate. The vertical isolation gaps 304 may at least partially surround the multi-layer embedded structure(s) on an assembly 120 formed by bonding to a similarly prepared die 102' or wafer (with or without multi-layered embedded structures 110 or 402.

Figure 15A:
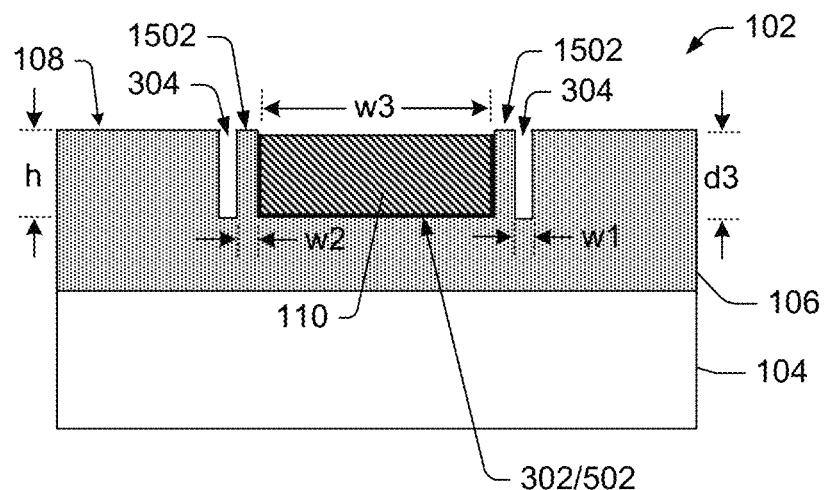
FIGS. 15A-15B show cross-section profile views of examples of microelectronic assemblies with laterally unconfined interconnect structures and spacers, according to various embodiments.
Figure 15B:
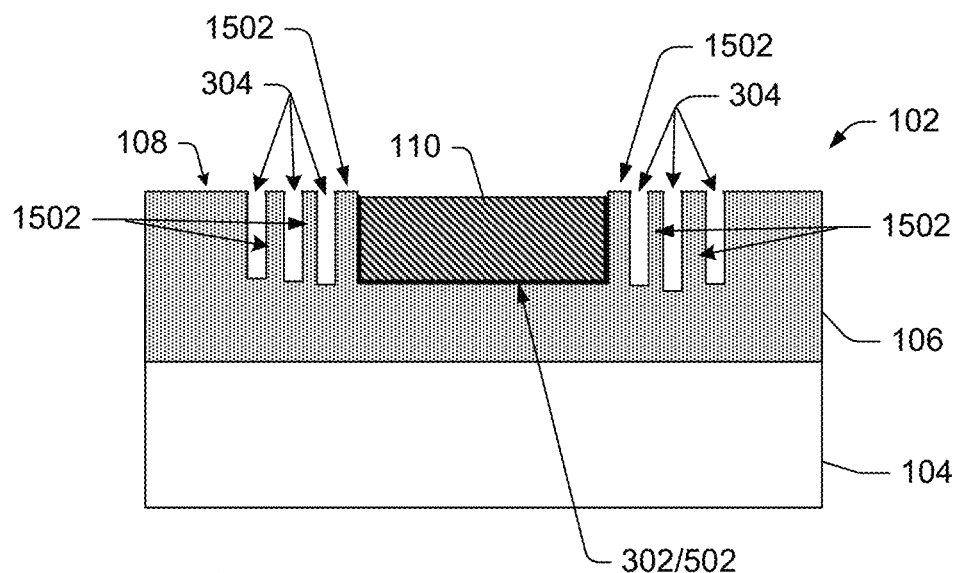

FIGS. 15A and 15B illustrate another embodiment where the embedded conductive structure 110 or multiple structures 402 are (at least partly) surrounded by vertical isolation gaps 304 disposed in the dielectric layer 106. The isolation gaps 304 comprise a channel with the open end exposed to the bonding surface 108 of the dielectric layer 106 and the blind end disposed within the dielectric layer 106.

However, in the example, a dielectric spacer 1502 is disposed between an isolation gap 304 and the barrier layer 302. In other words, a portion of the dielectric layer 106 is disposed between the conductive structure 110 (or 402) (which may be partly or fully surrounded by a barrier layer 302 and/or seed layer 502) and the isolation gap 304, rather than the isolation gap 304 being adjacent to the conductive structure 110 (or 402). This discrete portion of the dielectric layer 106 comprises a dielectric spacer 1502.

Referring to FIG. 15A, in some applications, the width ("w1") of a vertical isolation gap 304 is larger than the width or thickness of the barrier layer 302. Also, in some applications, the width ("w1") of the isolation gap 304 or the width ("w2") of the spacer 1502 is less than the width ("w3") or diameter of the conductive structure 110 (or 420). The aspect ratio, e.g., the height ("h") v. the width ("w2") of the dielectric spacer 1502 may be configured so that the thin dielectric spacer 1502 by itself may be slightly compliant. The compliance of the dielectric spacer 1502 may be increased by increasing the relative height ("h") of the dielectric spacer 1502 with respect to the relative width ("w2") of the dielectric spacer 1502. For instance, the dielectric spacer 1502 may have reduced rigidity (as compared to the bulk of the dielectric layer 106) and may deflect with expansion of the metal of the conductive structure 110 (or 402) during annealing.

A vertical isolation gap 304 decouples the conductive structure 110 and the dielectric spacer 1502 from the mechanical influence of the bulk of the dielectric layer 106. Typically, the width of the dielectric spacer 1502 is less than the width of the dielectric layer 106 between any two adjacent conductive structures 110 (or 402).

FIG. 15B illustrates an embodiment in which an array of dielectric spacers 1502 and vertical isolation gaps 304 surrounds the conductive structure(s) 110 (or 402). The depth ("d3") of each of the vertical gaps 304 (including between the spacers 1502) may be similar or different. In one embodiment, the depth ("d3") of the vertical gaps 304 are graded, such that the deepest gap 304 is disposed closest to the conductive structure 110 (or 402) and the shallowest gap 304 is the furthest from the conductive structure 110 (or 402).

Still in other embodiments, the vertical isolation gaps 304 may have different widths ("w1") and/or the dielectric spacers 1502 may have different widths ("w2") and various adequate geometric patterns. Still in other embodiments, the portion of isolation gap(s) 304 in close proximity to the bonding surface 108 (or at any point along a length of the gap(s) 304 for that matter) may be closed or partially closed or blocked or partially blocked, forming a blind or partially blind embedded isolation gap 304.

Figure 16:
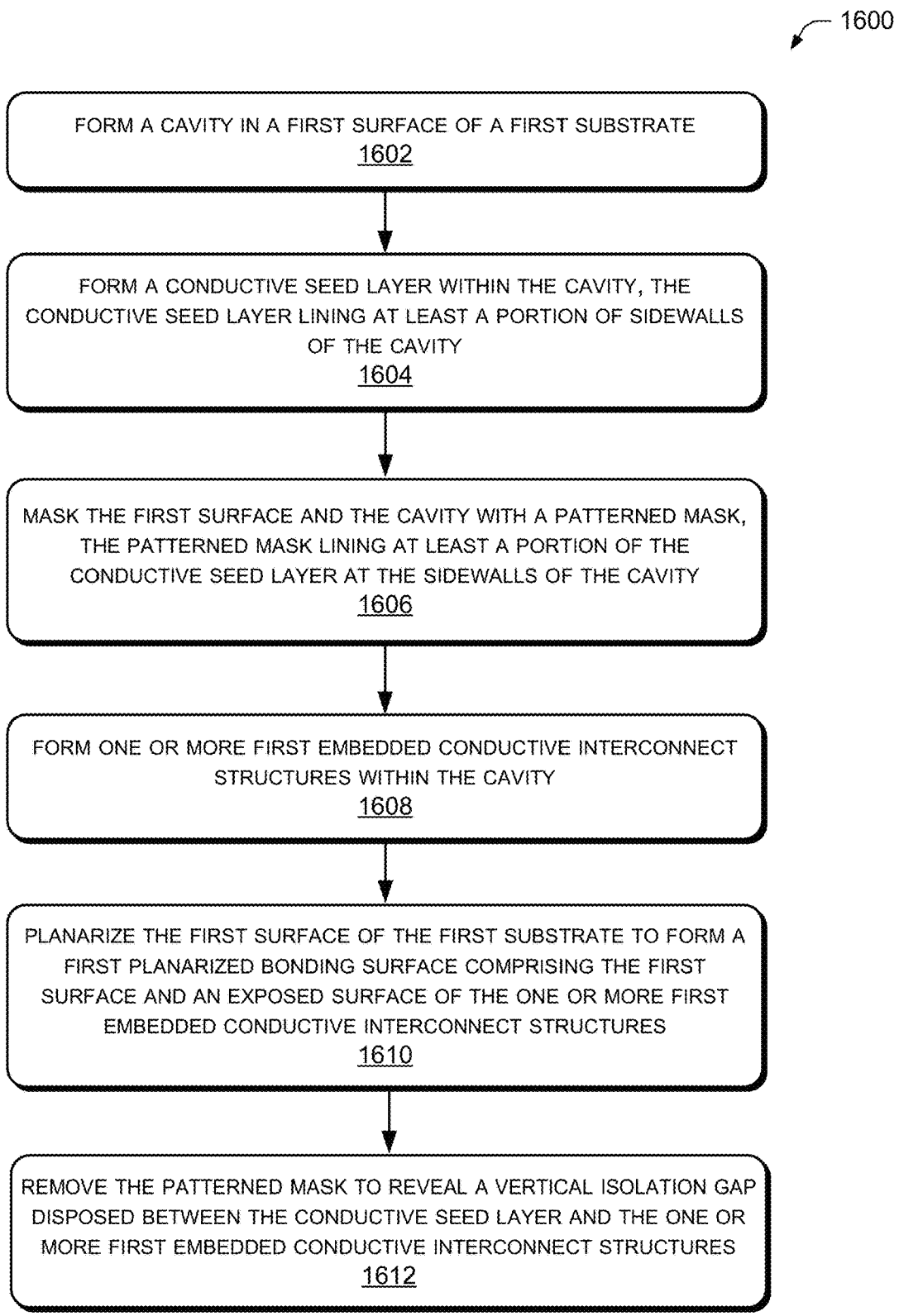
FIG. 16 shows a flow diagram illustrating an example process of forming a microelectronic assembly with a laterally unconfined interconnect structure, according to various embodiments.

FIG. 16 is a textual flow diagram illustrating an example process 1600 for forming a microelectronic assembly with a laterally unconfined interconnect structure 110 or 402, according to various embodiments. The process 1600 may be applicable to the embodiments discussed above, or to other similar embodiments. At 1602, the process includes forming a cavity (such as a cavity 114, for example) in a first surface (such as a bonding layer 106, for example) of a first substrate (such as a die 102, for example).

At 1604, the process includes forming a barrier layer (such as a barrier layer 302, for example) and/or a conductive seed layer (such as a seed layer 502, for example) within the cavity. In an example, the barrier layer and/or the conductive seed layer lines at least a portion of sidewalls of the cavity. At 1606, the process includes masking the first surface and the cavity with a patterned mask (such as a mask 504, for example). In an example, the patterned mask lines at least a portion of the barrier layer and/or conductive seed layer at the sidewalls of the cavity.

At 1608, the process includes forming one or more first embedded conductive interconnect structures (such as conductive structures 110 or 402, for example) within the cavity. In one embodiment, the process includes forming the one or more first embedded conductive interconnect structures by filling the cavity using a damascene process. For instance, the process includes filling the cavity with a conductive material, through the patterned mask.

In one embodiment, the process includes filling the cavity with multiple layers of different or similar conductive materials through the patterned mask. In an example, the process includes separating one or more of the multiple layers with a diffusion barrier layer.

At 1610, the process includes planarizing the first surface of the first substrate to form a first planarized bonding surface (such as bonding surface 108, for example) comprising the first surface and an exposed surface of the one or more first embedded conductive interconnect structures. At 1612, the process includes removing the patterned mask to reveal a vertical isolation gap (such as vertical isolation gap 304, for example) disposed between the conductive seed layer and the one or more first embedded conductive interconnect structures.

In another embodiment, the process includes: forming one or more second embedded conductive interconnect structures (such as interconnect structures 110' or 402', for example) in a second substrate (such as die 102', for example); planarizing a first surface of the second substrate to form a second planarized bonding surface (such as bonding surface 108', for example) comprising the first surface of the second substrate and an exposed surface of the one or more second embedded conductive interconnect structures; bonding the second planarized bonding surface of the second substrate to the first planarized bonding surface of the first substrate via direct bonding without adhesive, at a first temperature; and directly bonding the one or more second embedded conductive interconnect structures to the one or more first embedded conductive interconnect structures at a second temperature, less than or equal to the first temperature.

In an embodiment, the process includes lining one or more sides of the vertical isolation gap with a diffusion barrier layer (such as barrier layer 302, for example). In another embodiment, the process includes filling the vertical isolation gap and/or surrounding the one or more first embedded conductive interconnect structures with a predetermined adhesive barrier layer (such as barrier layer 1402, for example) having anisotropic lateral adhesive properties, the predetermined adhesive barrier layer being strongly bonded to the one or more first embedded conductive interconnect structures and weakly bonded to material of the first substrate.

In an alternate embodiment, the process includes: forming the one or more first embedded conductive interconnect structures within a cavity in a first surface of a first substrate; planarizing the first surface of the first substrate to form a first planarized bonding surface comprising the first surface and an exposed surface of the one or more first embedded conductive interconnect structures; masking the first planarized bonding surface with a patterned mask, the patterned mask including one or more openings over the first surface at a perimeter of the cavity; selectively removing portions of the first substrate corresponding to the openings in the patterned mask; and removing the patterned mask to reveal one or more vertical isolation gaps disposed between the one or more first embedded conductive interconnect structures and the material of the first surface of the first substrate.

As an option, the process may include selectively removing additional portions of the first substrate corresponding to other openings in the patterned mask and forming one or more additional vertical isolation gaps disposed into the bonding layer and within the material of the first substrate, near to the embedded conductive interconnect structures without contacting the embedded conductive interconnect structures. The discrete portions of dielectric material of the first substrate remaining between the additional vertical isolation gaps comprise dielectric spacers having a degree of compliance.

In an embodiment, the process includes lining one or more sides of the one or more vertical isolation gaps with a diffusion barrier layer. In an implementation, the process includes filling the one or more vertical isolation gaps with a compressible material. The compressible material is disposed between the one or more first embedded conductive interconnect structures and the material of the first surface of the first substrate.

In another implementation, the process includes filling the one or more vertical isolation gaps and/or surrounding the one or more first embedded conductive interconnect structures with a predetermined adhesive barrier layer having anisotropic lateral adhesive properties. The predetermined adhesive barrier layer being strongly bonded to the one or more first embedded conductive interconnect structures and weakly bonded to material of the first substrate.

In a further implementation, the process includes forming the one or more first embedded conductive interconnect structures to have a predetermined grain texture orientation.

The order in which the disclosed processes are described is not intended to be construed as a limitation, and any number of the described process blocks can be combined in any order to implement the processes, or alternate processes. Additionally, individual blocks may be deleted from the processes without departing from the spirit and scope of the subject matter described herein. Furthermore, the disclosed processes can be implemented in any suitable manufacturing or processing apparatus or system, along with any hardware, software, firmware, or a combination thereof, without departing from the scope of the subject matter described herein.

Although various implementations and examples are discussed herein, further implementations and examples may be possible by combining the features and elements of individual implementations and examples.

The techniques, components, and devices described herein are not limited to the illustrations of FIGS. 1-16, and may be applied to other designs, types, arrangements, and constructions including with other electrical components without departing from the scope of the disclosure. In some cases, additional or alternative components, techniques, sequences, or processes may be used to implement the techniques described herein. Further, the components and/or techniques may be arranged and/or combined in various combinations, while resulting in similar or approximately identical results.

CONCLUSION

Although the implementations of the disclosure have been described in language specific to structural features and/or methodological acts, it is to be understood that the implementations are not necessarily limited to the specific features or acts described. Rather, the specific features and acts are disclosed as representative forms of implementing example devices and techniques.

What is claimed is:

1. A method, comprising:
forming a cavity in a first surface of a first substrate, wherein the first substrate comprises a second surface opposite the first surface;
forming a conductive seed layer within the cavity, the conductive seed layer lining at least a portion of sidewalls of the cavity;
masking the first surface and the cavity with a patterned mask, the patterned mask lining at least a portion of the conductive seed layer at the sidewalls of the cavity;
forming one or more first embedded conductive interconnect structures within the cavity;
planarizing the first surface of the first substrate to form a first planarized bonding surface opposite the second surface and comprising an exposed surface of the one or more first embedded conductive interconnect structures; and
removing the patterned mask to reveal a vertical isolation gap disposed between the conductive seed layer and the one or more first embedded conductive interconnect structures.

2. The method of claim 1, further comprising forming the one or more first embedded conductive interconnect structures by filling the cavity using a damascene process.

3. The method of claim 2, further comprising filling the cavity with a conductive material, through the patterned mask.

4. The method of claim 2, further comprising filling the cavity with multiple layers of different conductive materials, through the patterned mask.

5. The method of claim 4, further comprising separating one or more of the multiple layers with a diffusion barrier layer.

6. The method of claim 1, further comprising:
forming one or more second embedded conductive interconnect structures in a second substrate having opposing first and second surfaces;
planarizing the first surface of the second substrate to form a second planarized bonding surface opposite the second surface of the second substrate and comprising an exposed surface of the one or more second embedded conductive interconnect structures;
bonding the second planarized bonding surface of the second substrate to the first planarized bonding surface of the first substrate via direct bonding without adhesive, at a first temperature; and
directly bonding the one or more second embedded conductive interconnect structures to the one or more first embedded conductive interconnect structures at a second temperature, less than or equal to the first temperature.

7. The method of claim 1, further comprising lining one or more sides of the vertical isolation gap with a diffusion barrier layer.

8. The method of claim 1, further comprising filling the vertical isolation gap and/or surrounding the one or more first embedded conductive interconnect structures with a predetermined adhesive barrier layer having anisotropic lateral adhesive properties, the predetermined adhesive barrier layer being strongly bonded to the one or more first embedded conductive interconnect structures and weakly bonded to material of the first substrate.

9. A method, comprising:
forming one or more first embedded conductive interconnect structures within a cavity in a first surface of a first substrate, wherein the first substrate comprises a second surface opposite the first surface;
planarizing the first surface of the first substrate to form a first planarized bonding surface opposite the second surface and comprising an exposed surface of the one or more first embedded conductive interconnect structures;
masking the first planarized bonding surface with a patterned mask, the patterned mask including one or more openings over the first surface at a perimeter of the cavity;
selectively removing portions of the first substrate corresponding to the openings in the patterned mask; and
removing the patterned mask to reveal one or more vertical isolation gaps disposed between the one or more first embedded conductive interconnect structures and the material of the first substrate.

10. The method of claim 9, further comprising lining one or more sides of the one or more vertical isolation gaps with a diffusion barrier layer.

11. The method of claim 9, further comprising filling the one or more vertical isolation gaps with a compressible material, and wherein the compressible material is disposed between the one or more first embedded conductive interconnect structures and the material of the first substrate.

12. The method of claim 9, further comprising filling the one or more vertical isolation gaps and/or surrounding the one or more first embedded conductive interconnect structures with a predetermined adhesive barrier layer having anisotropic lateral adhesive properties, the predetermined adhesive barrier layer being strongly bonded to the one or more first embedded conductive interconnect structures and weakly bonded to material of the first substrate.

13. The method of claim 9, further comprising forming the one or more first embedded conductive interconnect structures to have a predetermined grain texture orientation.

14. A method, comprising:
forming a cavity in a first surface of a first substrate, wherein the cavity comprises at least one sidewall and wherein the first substrate comprises a second surface opposite the first surface;
forming a patterned mask over the substrate, wherein the patterned mask covers at least a portion of the at least one sidewall;
forming a conductive interconnect structure within the cavity;
planarizing the first substrate to form a planarized bonding surface opposite the second surface, wherein the planarized bonding surface comprises an exposed surface of the conductive interconnect structure; and
removing the patterned mask to reveal a vertical isolation gap between the at least one sidewall and the conductive interconnect structure.

15. The method of claim 14, further comprising:
before forming the patterned mask over the substrate, forming a conductive seed layer within the cavity, wherein a portion of the conductive seed layer covers the portion of the at least one sidewall and wherein forming the patterned mask over the substrate comprises forming the patterned mask such that it lines the portion of the conductive seed layer.

16. The method of claim 15, wherein portion of the conductive seed layer comprises a first portion of the conductive seed layer, wherein forming the conductive seed layer within the cavity comprises forming the conductive seed layer within the cavity such that a second portion of the conductive seed layer at least partially covers a bottom surface of the cavity, and wherein forming the conductive interconnect structure within the cavity comprises forming the conductive interconnect structure within the cavity such that it at least partially covers the second portion of the conductive seed layer.

17. The method of claim 15, wherein the vertical isolation gap is between the conductive seed layer and the conductive interconnect structure.

18. The method of claim 15, wherein the conductive seed layer comprises copper.

19. The method of claim 14, further comprising:
after removing the patterned mask, forming a barrier layer within the vertical isolation gap.

20. The method of claim 14, further comprising:
before forming the patterned mask over the substrate, forming a barrier layer within the cavity.

\* \* \* \* \*